United States Patent
Baba et al.

(10) Patent No.: US 11,251,019 B2
(45) Date of Patent: *Feb. 15, 2022

(54) PLASMA DEVICE

(71) Applicant: TOYOTA JIDOSHA KABUSHIKI KAISHA, Toyota (JP)

(72) Inventors: Tetsuharu Baba, Toyota (JP); Noriyuki Kato, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 105 days.

This patent is subject to a terminal disclaimer.

(21) Appl. No.: 15/834,812

(22) Filed: Dec. 7, 2017

(65) Prior Publication Data
US 2018/0174800 A1    Jun. 21, 2018

(30) Foreign Application Priority Data

Dec. 15, 2016  (JP) .............................. JP2016-243371

(51) Int. Cl.
*H01J 37/32* (2006.01)
*C23C 16/50* (2006.01)
(Continued)

(52) U.S. Cl.
CPC ...... *H01J 37/32009* (2013.01); *C23C 16/042* (2013.01); *C23C 16/458* (2013.01);
(Continued)

(58) Field of Classification Search
None
See application file for complete search history.

(56) References Cited

U.S. PATENT DOCUMENTS 4,369,730 A * 1/1983 Izu .................. C23C 16/545
                                                118/50.1
4,379,181 A * 4/1983 Cannella ............ C23C 16/509
                                                136/258
(Continued)

FOREIGN PATENT DOCUMENTS

CZ      2016603 A3 * 10/2017 ........ H01J 37/32091
JP      S59-069494 A     4/1984
(Continued)

OTHER PUBLICATIONS

Mar. 20, 2020 Office Action issued in U.S. Appl. No. 15/491,350.
(Continued)

*Primary Examiner* — Jeffrie R Lund
*Assistant Examiner* — Stanislav Antolin
(74) *Attorney, Agent, or Firm* — Oliff PLC

(57) ABSTRACT

The plasma device includes a vessel with the first and second molds facing to each other. A work is sealed in the closed first and second molds. The work includes an object to be processed with a part to be processed and a part not to be processed on an outer periphery of the part to be processed, and a masking member covering the part not to be processed. The first mold includes a facing plane portion disposed facing an outer periphery surface of the work, a first recessed portion disposed facing the part to be processed and generating plasma, and a second recessed portion disposed facing the part not to be processed between the facing plane portion and the first recessed portion and generating plasma. A depth of the second recessed portion is different from a depth of the first recessed portion.

8 Claims, 11 Drawing Sheets

(51) Int. Cl.
*C23C 16/04* (2006.01)
*H01M 8/0206* (2016.01)
*H01M 8/04029* (2016.01)
*C23C 16/503* (2006.01)
*C23C 16/458* (2006.01)
*C23C 16/509* (2006.01)

(52) U.S. Cl.
CPC ............ *C23C 16/50* (2013.01); *C23C 16/503* (2013.01); *C23C 16/509* (2013.01); *H01J 37/32917* (2013.01); *H01M 8/0206* (2013.01); *H01M 8/04029* (2013.01); *H01J 2237/334* (2013.01); *H01J 2237/3321* (2013.01)

(56) References Cited

U.S. PATENT DOCUMENTS

| | | | |
|---|---|---|---|
| 4,389,970 A | 6/1983 | Edgerton | |
| 4,475,223 A * | 10/1984 | Taniguchi | G03F 7/20 250/491.1 |
| 4,542,711 A * | 9/1985 | Izu | C23C 16/545 118/50.1 |
| 4,609,566 A | 9/1986 | Hongo et al. | |
| 4,718,340 A * | 1/1988 | Love, III | B41C 1/055 101/116 |
| 4,915,057 A * | 4/1990 | Boudreau | C23C 14/042 118/505 |
| 4,920,917 A * | 5/1990 | Nakatani | C23C 16/52 118/718 |
| 5,063,951 A * | 11/1991 | Bard | B08B 3/04 118/411 |
| 5,354,413 A | 10/1994 | Smesny et al. | |
| 5,423,971 A * | 6/1995 | Arnold | H01J 37/32091 118/718 |
| 5,705,019 A * | 1/1998 | Yamada | H01J 37/32082 156/345.44 |
| 5,733,511 A * | 3/1998 | De Francesco | H01J 37/32174 422/186.05 |
| 6,004,617 A * | 12/1999 | Schultz | B01J 19/0046 257/E43.005 |
| 6,022,462 A | 2/2000 | Ikeda et al. | |
| 6,162,323 A * | 12/2000 | Koshimizu | H01J 37/3244 156/345.26 |
| 6,432,577 B1 * | 8/2002 | Shul | H01M 2/0202 429/162 |
| 7,098,045 B2 | 8/2006 | Noji et al. | |
| 7,649,159 B2 | 1/2010 | Matsuura et al. | |
| 7,737,035 B1 * | 6/2010 | Lind | C23C 16/4409 438/680 |
| 7,993,457 B1 * | 8/2011 | Krotov | C23C 16/45544 118/719 |
| 9,515,633 B1 * | 12/2016 | Long | H03H 7/38 |
| 9,581,741 B1 * | 2/2017 | Berland | B41C 1/055 101/116 |
| 10,385,455 B2 * | 8/2019 | Iizuka | H01J 37/32532 156/345.43 |
| 10,597,775 B2 * | 3/2020 | Iizuka | H01J 37/32449 438/710 |
| 2001/0000198 A1 | 4/2001 | Takeshita et al. | |
| 2001/0009139 A1 * | 7/2001 | Shan | H01J 37/32165 118/723 E |
| 2001/0050057 A1 | 12/2001 | Yonezawa et al. | |
| 2001/0055823 A1 * | 12/2001 | Tran | H01L 21/67751 438/14 |
| 2002/0012266 A1 * | 1/2002 | Gogl | G11C 11/16 365/158 |
| 2002/0029791 A1 * | 3/2002 | Matsuoka | H01L 21/67253 134/18 |
| 2002/0052668 A1 * | 5/2002 | Nishiumi | H01L 21/67253 700/121 |
| 2002/0088399 A1 * | 7/2002 | Noji | B08B 3/041 118/715 |
| 2002/0096258 A1 * | 7/2002 | Savas | C23C 16/505 156/345.48 |
| 2002/0139302 A1 * | 10/2002 | Nagashima | H01L 21/67017 118/715 |
| 2002/0170676 A1 * | 11/2002 | Mitrovic | H01J 37/32082 156/345.47 |
| 2002/0193034 A1 * | 12/2002 | Ota | C23C 16/4401 445/16 |
| 2003/0038112 A1 * | 2/2003 | Liu | C23C 16/509 216/60 |
| 2003/0103877 A1 * | 6/2003 | Long | H01J 37/32009 422/186.04 |
| 2003/0137250 A1 * | 7/2003 | Mitrovic | H01J 37/32532 315/111.21 |
| 2003/0137251 A1 * | 7/2003 | Mitrovic | H01J 37/32009 315/111.21 |
| 2003/0168009 A1 | 9/2003 | Denes et al. | |
| 2003/0196604 A1 * | 10/2003 | Sidhwa | H01L 21/68735 118/728 |
| 2004/0007326 A1 * | 1/2004 | Roche | H01J 37/32935 156/345.24 |
| 2004/0020435 A1 * | 2/2004 | Tsuchiya | C23C 14/042 118/723 VE |
| 2004/0029339 A1 * | 2/2004 | Yamamoto | H01J 37/32192 438/222 |
| 2004/0083975 A1 * | 5/2004 | Tong | H01J 37/32623 118/728 |
| 2004/0142558 A1 * | 7/2004 | Granneman | C23C 16/4411 438/680 |
| 2004/0159287 A1 * | 8/2004 | Hoffman | H01J 37/3244 118/728 |
| 2004/0163766 A1 * | 8/2004 | Kanarov | H01J 27/18 156/345.49 |
| 2004/0168770 A1 * | 9/2004 | Mitrovic | H01J 37/32532 156/345.43 |
| 2004/0238488 A1 * | 12/2004 | Choi | H01J 37/32009 216/58 |
| 2005/0039682 A1 * | 2/2005 | Dhindsa | H01J 37/32174 118/723 E |
| 2005/0082007 A1 * | 4/2005 | Nguyen | H01J 37/32623 156/345.51 |
| 2005/0095873 A1 * | 5/2005 | Granneman | H01L 21/324 438/795 |
| 2005/0133166 A1 * | 6/2005 | Satitpunwaycha | H01J 37/321 156/345.51 |
| 2005/0173067 A1 * | 8/2005 | Lim | H01J 37/32532 156/345.32 |
| 2005/0178401 A1 * | 8/2005 | Boyers | A61L 2/183 134/1.3 |
| 2005/0178505 A1 * | 8/2005 | Kim | H01J 37/32009 156/345.47 |
| 2005/0211167 A1 * | 9/2005 | Gunji | C23C 16/44 118/715 |
| 2005/0263484 A1 * | 12/2005 | Park | H01L 21/02087 216/59 |
| 2006/0008676 A1 * | 1/2006 | Ebata | C04B 41/52 428/698 |
| 2006/0051602 A1 * | 3/2006 | Iacovangelo | C23C 16/4404 428/472 |
| 2006/0086321 A1 * | 4/2006 | Brody | C23C 14/042 118/720 |
| 2006/0165994 A1 * | 7/2006 | Dalakos | C04B 41/009 428/408 |
| 2006/0232471 A1 * | 10/2006 | Coumou | H01J 37/32174 342/450 |
| 2007/0031600 A1 * | 2/2007 | Devitt | H01L 21/67051 427/248.1 |
| 2007/0034228 A1 * | 2/2007 | Devitt | H01J 37/3277 134/1 |
| 2007/0068900 A1 * | 3/2007 | Kim | H01J 37/32532 216/67 |
| 2007/0074664 A1 * | 4/2007 | Nishimura | C23C 16/272 118/723 E |
| 2007/0284045 A1 * | 12/2007 | Fischer | H01J 37/32082 156/345.43 |
| 2007/0292632 A1 | 12/2007 | Yoshida | |
| 2008/0083710 A1 * | 4/2008 | Chen | H01J 37/32091 219/121.48 |

(56) References Cited

U.S. PATENT DOCUMENTS

| | | | | |
|---|---|---|---|---|
| 2008/0121526 A1* | 5/2008 | Hsiao | C25D 17/12 | 205/80 |
| 2008/0122369 A1* | 5/2008 | Nitschke | H01J 37/3299 | 315/111.21 |
| 2008/0179010 A1* | 7/2008 | Bailey, III | H01L 21/3065 | 156/345.43 |
| 2008/0182412 A1* | 7/2008 | Bailey, III | H01L 21/0209 | 438/689 |
| 2008/0227301 A1* | 9/2008 | Fang | H01L 21/3065 | 438/706 |
| 2008/0260938 A1* | 10/2008 | Ikeda | C23C 14/042 | 427/66 |
| 2008/0286489 A1* | 11/2008 | Wang | H01J 37/32458 | 427/569 |
| 2009/0042085 A1* | 2/2009 | Watanabe | H01M 8/0228 | 429/406 |
| 2009/0166326 A1* | 7/2009 | Sexton | H01J 37/32559 | 216/67 |
| 2009/0183683 A1* | 7/2009 | Kobayashi | C23C 16/4401 | 118/726 |
| 2009/0194026 A1* | 8/2009 | Burrows | C23C 16/54 | 118/719 |
| 2009/0202734 A1* | 8/2009 | Dhindsa | C23C 16/52 | 427/446 |
| 2009/0206057 A1* | 8/2009 | Huang | G03F 1/32 | 216/67 |
| 2009/0314962 A1* | 12/2009 | Dorai | H01J 37/04 | 250/492.21 |
| 2010/0000684 A1 | 1/2010 | Choi | | |
| 2010/0003824 A1* | 1/2010 | Kadkhodayan | H01J 37/32541 | 438/710 |
| 2010/0068887 A1* | 3/2010 | Harrington | H01J 37/32091 | 438/710 |
| 2010/0075506 A1 | 3/2010 | Ochi | | |
| 2010/0123502 A1* | 5/2010 | Bhutta | H03H 7/18 | 327/237 |
| 2010/0151686 A1* | 6/2010 | Fang | H01J 37/32366 | 438/710 |
| 2010/0159703 A1* | 6/2010 | Fischer | H01J 37/32449 | 438/710 |
| 2010/0173074 A1* | 7/2010 | Juarez | C23C 16/45523 | 427/255.28 |
| 2010/0189924 A1* | 7/2010 | D'Evelyn | C23C 16/274 | 427/575 |
| 2010/0194195 A1* | 8/2010 | Coumou | H01J 37/32165 | 307/24 |
| 2010/0202860 A1* | 8/2010 | Reed | H01L 21/68742 | 414/221 |
| 2010/0221426 A1* | 9/2010 | Sferlazzo | C23C 16/45551 | 427/255.26 |
| 2010/0230086 A1* | 9/2010 | Tsuzuki | H01L 23/3735 | 165/185 |
| 2010/0255196 A1* | 10/2010 | Geisler | C23C 16/4587 | 427/248.1 |
| 2010/0296253 A1* | 11/2010 | Miyamoto | C23C 4/01 | 361/705 |
| 2010/0327927 A1* | 12/2010 | Nagarkatti | H03G 3/3047 | 327/164 |
| 2011/0005681 A1* | 1/2011 | Savas | C23C 16/24 | 156/345.33 |
| 2011/0005682 A1* | 1/2011 | Savas | C23C 16/24 | 156/345.34 |
| 2011/0006040 A1* | 1/2011 | Savas | C23C 16/24 | 216/71 |
| 2011/0068087 A1* | 3/2011 | Iwasaki | H01J 37/32623 | 216/67 |
| 2011/0068371 A1* | 3/2011 | Oka | H01L 29/861 | 257/194 |
| 2011/0076848 A1* | 3/2011 | Datta | C23C 16/4409 | 438/689 |
| 2011/0094994 A1* | 4/2011 | Todorow | C23C 16/505 | 216/68 |
| 2011/0097901 A1* | 4/2011 | Banna | H01J 37/321 | 438/710 |
| 2011/0135842 A1* | 6/2011 | Faguet | C23C 16/4401 | 427/569 |
| 2011/0143019 A1* | 6/2011 | Mosso | C23C 16/24 | 427/58 |
| 2011/0155322 A1* | 6/2011 | Himori | H01J 37/32091 | 156/345.33 |
| 2011/0159200 A1* | 6/2011 | Kogure | H01L 21/68735 | 427/458 |
| 2011/0200741 A1* | 8/2011 | Fukao | C23C 14/042 | 427/66 |
| 2011/0212625 A1* | 9/2011 | Toyoda | C23C 16/4412 | 438/758 |
| 2011/0226728 A1* | 9/2011 | Blom | H05H 1/2475 | 216/13 |
| 2011/0241773 A1* | 10/2011 | Fisk | H01J 37/32174 | 330/124 R |
| 2011/0275219 A1* | 11/2011 | Fang | H01L 21/32138 | 438/713 |
| 2011/0305836 A1* | 12/2011 | Murata | C23C 16/45544 | 427/255.28 |
| 2012/0003396 A1* | 1/2012 | Maas | C23C 16/45551 | 427/569 |
| 2012/0097641 A1* | 4/2012 | Beckmann | H01J 37/321 | 438/710 |
| 2012/0097666 A1* | 4/2012 | Pohl | H05B 6/06 | 219/663 |
| 2012/0128895 A1* | 5/2012 | Ota | G11B 5/8404 | 427/577 |
| 2012/0148738 A1* | 6/2012 | Ikejiri | H03F 3/20 | 315/111.21 |
| 2012/0161405 A1* | 6/2012 | Mohn | C23C 16/401 | 279/142 |
| 2012/0183887 A1* | 7/2012 | Iseki | B82Y 30/00 | 429/518 |
| 2012/0186521 A1* | 7/2012 | Iwasaki | C23C 16/45517 | 118/723 AN |
| 2012/0196050 A1* | 8/2012 | Vermeer | C23C 16/45551 | 427/535 |
| 2012/0231374 A1* | 9/2012 | Iseki | H01M 8/0234 | 429/518 |
| 2012/0262064 A1* | 10/2012 | Nagarkatti | H03F 3/20 | 315/111.21 |
| 2012/0289054 A1* | 11/2012 | Holland | H01J 37/32899 | 438/711 |
| 2013/0012029 A1* | 1/2013 | Vermeer | C23C 16/0245 | 438/758 |
| 2013/0115780 A1* | 5/2013 | Okumura | H01J 37/321 | 156/345.28 |
| 2013/0126476 A1* | 5/2013 | Marakhtanov | H01J 37/3244 | 216/67 |
| 2013/0126486 A1* | 5/2013 | Bise | H01J 37/3244 | 219/121.48 |
| 2013/0126513 A1* | 5/2013 | Marakhtanov | H01J 37/32091 | 219/383 |
| 2013/0130107 A1* | 5/2013 | Uchida | H05B 6/06 | 219/663 |
| 2013/0149075 A1* | 6/2013 | Shah | H01L 21/67736 | 414/217 |
| 2013/0153536 A1* | 6/2013 | Shao | C23C 16/042 | 216/59 |
| 2013/0176691 A1* | 7/2013 | Stevens | H01L 23/564 | 361/748 |
| 2013/0233491 A1* | 9/2013 | Choi | H01J 37/32541 | 156/345.51 |
| 2013/0276978 A1* | 10/2013 | Bluck | C23C 14/042 | 156/345.3 |
| 2013/0284370 A1* | 10/2013 | Collins | H01J 37/321 | 156/345.28 |
| 2013/0287526 A1* | 10/2013 | Bluck | H01L 21/67736 | 414/217 |
| 2013/0337657 A1 | 12/2013 | Savas et al. | | |
| 2014/0000843 A1* | 1/2014 | Dunn | H01J 37/32623 | 216/59 |

(56) References Cited

U.S. PATENT DOCUMENTS

| | | | | |
|---|---|---|---|---|
| 2014/0030445 A1* | 1/2014 | Vermeer | ............ | C23C 16/45551 427/569 |
| 2014/0037847 A1* | 2/2014 | Vermeer | ............ | C23C 16/45551 427/255.28 |
| 2014/0037853 A1* | 2/2014 | Lee | ............ | B05D 7/00 427/421.1 |
| 2014/0044887 A1* | 2/2014 | Vermeer | ............ | C23C 16/4401 427/535 |
| 2014/0175055 A1* | 6/2014 | Sasagawa | ............ | H01J 37/3244 156/345.26 |
| 2014/0199788 A1* | 7/2014 | Vermont | ............ | H01J 37/32082 156/345.47 |
| 2014/0205068 A1* | 7/2014 | Mashita | ............ | G01N 23/201 378/86 |
| 2014/0220244 A1* | 8/2014 | Mane | ............ | H01J 37/32009 422/186.04 |
| 2014/0262746 A1* | 9/2014 | Chen | ............ | C25D 17/12 205/80 |
| 2015/0004318 A1* | 1/2015 | Alasaarela | ............ | H01J 37/3244 219/121.48 |
| 2015/0014178 A1* | 1/2015 | Hiraoka | ............ | H03H 7/38 |
| 2015/0086729 A1* | 3/2015 | Gortzen | ............ | H01J 37/3244 216/67 |
| 2015/0096495 A1* | 4/2015 | Jeong | ............ | H01J 37/04 250/492.21 |
| 2015/0099365 A1* | 4/2015 | Chen | ............ | H01J 37/32642 438/710 |
| 2015/0170947 A1* | 6/2015 | Bluck | ............ | H05H 1/2475 216/13 |
| 2015/0214083 A1* | 7/2015 | Kawakami | ............ | H01J 37/32807 156/345.27 |
| 2015/0225585 A1* | 8/2015 | De Rossi | ............ | C09D 11/322 347/20 |
| 2015/0255254 A1* | 9/2015 | Gebeshuber | ............ | C23C 16/50 427/8 |
| 2015/0279632 A1* | 10/2015 | Lin | ............ | H01L 21/30 438/798 |
| 2015/0329982 A1* | 11/2015 | Miura | ............ | H03H 7/18 327/237 |
| 2016/0010209 A1* | 1/2016 | Hattori | ............ | C23C 16/24 216/71 |
| 2016/0093901 A1* | 3/2016 | Yoshizumi | ............ | H01J 37/32009 315/111.21 |
| 2016/0122874 A1* | 5/2016 | Vermeer | ............ | C23C 16/24 156/345.33 |
| 2016/0148801 A1* | 5/2016 | Yabe | ............ | C23C 16/24 156/345.34 |
| 2016/0319422 A1 | 11/2016 | Kurita et al. | | |
| 2016/0329223 A1* | 11/2016 | Hirose | ............ | H01J 37/32807 156/345.27 |
| 2016/0362788 A1* | 12/2016 | Kurita | ............ | G03F 7/20 250/491.1 |
| 2017/0002468 A1* | 1/2017 | Choi | ............ | H01J 37/32366 |
| 2017/0018926 A1* | 1/2017 | Coumou | ............ | H01J 37/32174 |
| 2017/0058402 A1* | 3/2017 | Wenxu | ............ | C23C 16/52 118/718 |
| 2017/0062258 A1* | 3/2017 | Bluck | ............ | C23C 14/042 118/505 |
| 2017/0125200 A1* | 5/2017 | Burkhart | ............ | H05B 1/0233 |
| 2017/0209915 A1* | 7/2017 | Iguma | ............ | H01J 37/32165 307/24 |
| 2017/0209916 A1* | 7/2017 | Iguma | ............ | H01J 37/32091 219/383 |
| 2017/0229317 A1* | 8/2017 | Shen | ............ | C23C 14/50 |
| 2017/0271194 A1* | 9/2017 | Okita | ............ | H01J 37/32082 |
| 2017/0278761 A1* | 9/2017 | deVilliers | ............ | C23C 14/042 118/723 VE |
| 2017/0306483 A1* | 10/2017 | Iizuka | ............ | H01J 37/32834 |
| 2017/0306492 A1* | 10/2017 | Iizuka | ............ | H01J 37/32082 156/345.44 |
| 2017/0309455 A1* | 10/2017 | Yoshimura | ............ | H01J 37/32174 330/124 R |
| 2017/0335459 A1 | 11/2017 | Choi et al. | | |
| 2018/0148842 A1* | 5/2018 | Matsumoto | ............ | H01M 2/0202 429/162 |
| 2018/0174800 A1* | 6/2018 | Baba | ............ | H01J 37/3299 315/111.21 |
| 2019/0096640 A1* | 3/2019 | Kato | ............ | H01J 37/32082 156/345.43 |
| 2019/0276937 A1* | 9/2019 | Olejnicek | ............ | C23C 14/042 427/458 |

FOREIGN PATENT DOCUMENTS

| | | | | | |
|---|---|---|---|---|---|
| JP | H02-000369 U | | 1/1990 | | |
| JP | H02-102723 U | | 8/1990 | | |
| JP | 6000459 Y2 | * | 1/1994 | ............ | H01L 21/205 |
| JP | H07-180027 A | | 7/1995 | | |
| JP | H07-199450 A | | 8/1995 | | |
| JP | 2002-141398 A | | 5/2002 | | |
| JP | 2002-184708 A | | 6/2002 | | |
| JP | 2005-194589 A | | 7/2005 | | |
| JP | 2009-062579 A | | 3/2009 | | |
| JP | 2009062579 A | * | 3/2009 | ............ | H01L 21/205 |
| JP | 2012-238772 A | | 12/2012 | | |
| JP | 2013-206652 A | | 10/2013 | | |
| JP | 2013-237883 A | | 11/2013 | | |
| JP | 2015-025173 A | | 2/2015 | | |
| JP | 2017129086 A | * | 7/2017 | ............ | F02B 77/00 |
| JP | 2017129088 A | * | 7/2017 | ............ | B21K 3/02 |
| JP | 2017-197779 A | | 11/2017 | | |
| JP | 2017-197781 A | | 11/2017 | | |
| JP | 2017-197837 A | | 11/2017 | | |
| JP | 2017197779 A | * | 11/2017 | ............ | C23C 16/4412 |
| JP | 2017197781 A | * | 11/2017 | ............ | H01J 37/32834 |
| JP | 2017197837 A | * | 11/2017 | ............ | H01J 37/32174 |
| KR | 10-2006-0117794 A | | 11/2006 | | |
| KR | 10-2006-0128303 A | | 12/2006 | | |
| KR | 20170025417 A | * | 3/2017 | ............ | C23C 16/4412 |
| TW | 201303972 A | | 1/2013 | | |
| WO | 2003/104524 A1 | | 12/2003 | | |
| WO | WO-2014132892 A1 | * | 9/2014 | ............ | H01J 37/32091 |
| WO | WO-2016190007 A1 | * | 12/2016 | ............ | C23C 16/50 |
| WO | 2018/059609 A1 | | 4/2018 | | |

OTHER PUBLICATIONS

U.S. Appl. No. 15/491,350, filed Apr. 19, 2017 in the name of Yoshimura et al.
U.S. Appl. No. 16/058,362, filed Mar. 28, 2019 in the name of Kato.
U.S. Appl. No. 15/490,246 filed Mar. 24, 2020 in the name of Iizuka.
U.S. Appl. No. 15/491,231, filed Aug. 20, 2019 in the name of Iizuka.
Mar. 24, 2020 Office Action issued in U.S. Appl. No. 16/058,362.
Aug. 10, 2020 Office Action issued in U.S. Appl. No. 16/058,362.
Sep. 20, 2018 Office Action issued in U.S. Appl. No. 15/490,246.
Jul. 9, 2018 Office Action issued in U.S. Appl. No. 15/490,246.
Mar. 7, 2019 Office Action issued in U.S. Appl. No. 15/490,246.
Jun. 17, 2019 Advisory Action issued in U.S. Appl. No. 15/490,246.
Sep. 16, 2019 Office Action issued in U.S. Appl. No. 15/490,246.
Oct. 12, 2018 Office Action issued in U.S. Appl. No. 15/491,231.
Jan. 10, 2019 Office Action issued in U.S. Appl. No. 15/491,231.
Feb. 4, 2021 Office Action issued in U.S. Appl. No. 15/491,350.
"Physikalische Gasphasenabscheidung." Wikipedia, retrieved Jan. 19, 2021, https://de.wikipedia.org/wiki/Physikalische_Gasphasenabscheidung.
Mar. 2, 2021 Office Action issued in U.S. Appl. No. 16/058,362.
Oct. 1, 2020 Office Action issued in U.S. Appl. No. 15/491,350.
Dec. 18, 2020 Office Action issued in U.S. Appl. No. 15/491,350.
Aug. 25, 2021 Office Action issued in U.S. Appl. No. 15/491,350.
Jun. 24, 2021 Office Action issued in U.S. Appl. No. 16/058,362.
Oct. 8, 2021 Office Action issued in U.S. Appl. No. 16/058,362.
Dec. 9, 2021 Office Action issued in U.S. Appl. No. 15/491,350.

* cited by examiner

PLASMA DEVICE

CROSS REFERENCE TO RELATED APPLICATIONS

The present application claims the priority based on Japanese Patent Application No. 2016-243371 filed on Dec. 15, 2016, the disclosure of which is hereby incorporated by reference in its entirety.

BACKGROUND

Field

The present disclosure relates to a plasma device.

Related Art

There is known a device depositing a film on a substrate by a plasma CVD method. Japanese Patent Application Laid-open No. 2009-62579 describes the following film deposition device. With a substrate sandwiched between an upper wall and a lower wall of a film deposition chamber, the film deposition device deposits a film by filling the film deposition chamber with film deposition gas and generating plasma toward a ground electrode arranged on the upper side of the substrate from a high frequency electrode arranged on the lower side of the substrate in the film deposition chamber.

When an outer periphery of a film deposition part of a substrate includes a part on which a film is not to be deposited (hereinafter, also referred to as a "non-film deposition part"), a masking member is often disposed to cover the non-film deposition part. For example, at a part (non-film deposition part) between an upper wall and a lower wall of a film deposition chamber sandwiching the substrate, the entering of plasma is suppressed, which suppresses the increase of a temperature due to heat received from plasma. This increases a temperature difference between the non-film deposition part and the film deposition part. As a result, the temperature difference during film deposition between the non-film deposition part and the film deposition part may have caused deformation of an object to be processed, which have left deformation in the object to be processed even after the processing. Note that this problem occurs not only in film deposition using plasma but also in etching using plasma. Thus, there has been demanded, in the plasma device performing plasma processing of film deposition or etching, a technology capable of suppressing deformation of an object to be processed due to a temperature difference between a part to be processed and a part not to be processed of an object to be processed.

SUMMARY

The disclosure is made to address at least part of the above-described problem, and may be achieved by the following forms.

One aspect of the disclosure provides a plasma device that performs plasma processing on a work The plasma device comprises: a vessel including a first mold and a second mold that are disposed facing to each other and form sealed space in which the work is disposed. The work includes: an object to be processed with a part to be processed and a part not to be processed disposed in a peripheral side of the object relative to a part of the part to be processed as viewed along a direction perpendicular to the object; and a masking member covering the part not to be processed. The first mold includes: a first recessed portion that is disposed facing the part to be processed and generates plasma; a second recessed portion that is disposed facing at least a part of the masking member covering the part not to be processed and generates plasma; and a facing plane portion that is disposed to surround the first recessed portion and the second recessed portion, and is disposed at a position closer to the second mold than the first recessed portion and the second recessed portion. A depth of the second recessed portion is set to be a different value from a depth of the first recessed portion.

DETAILED DESCRIPTION

A. First Embodiment

Figure 1:
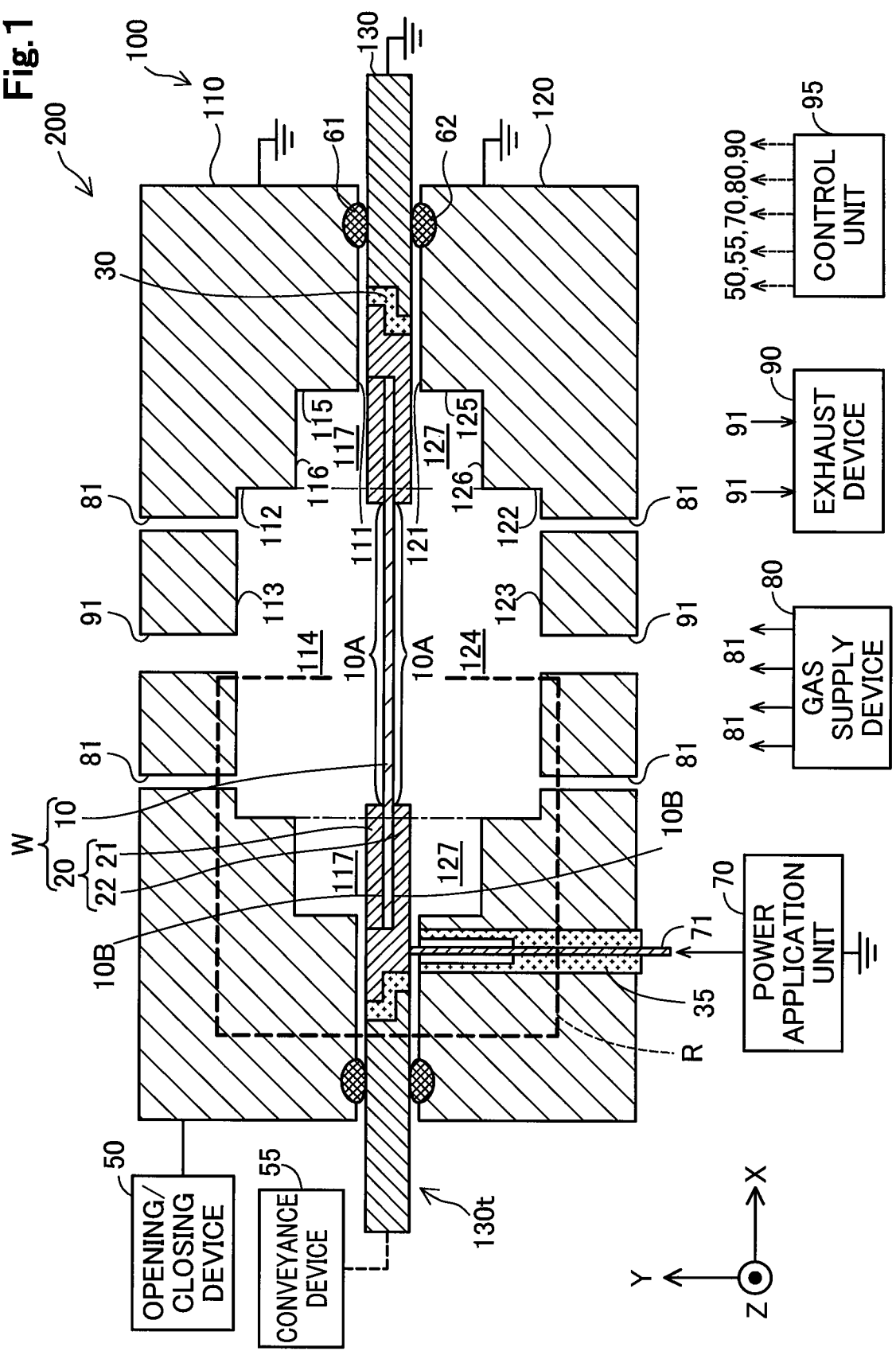
FIG. 1 is a schematic section view illustrating a configuration of a plasma device according to a first embodiment of the disclosure.
Figure 2:
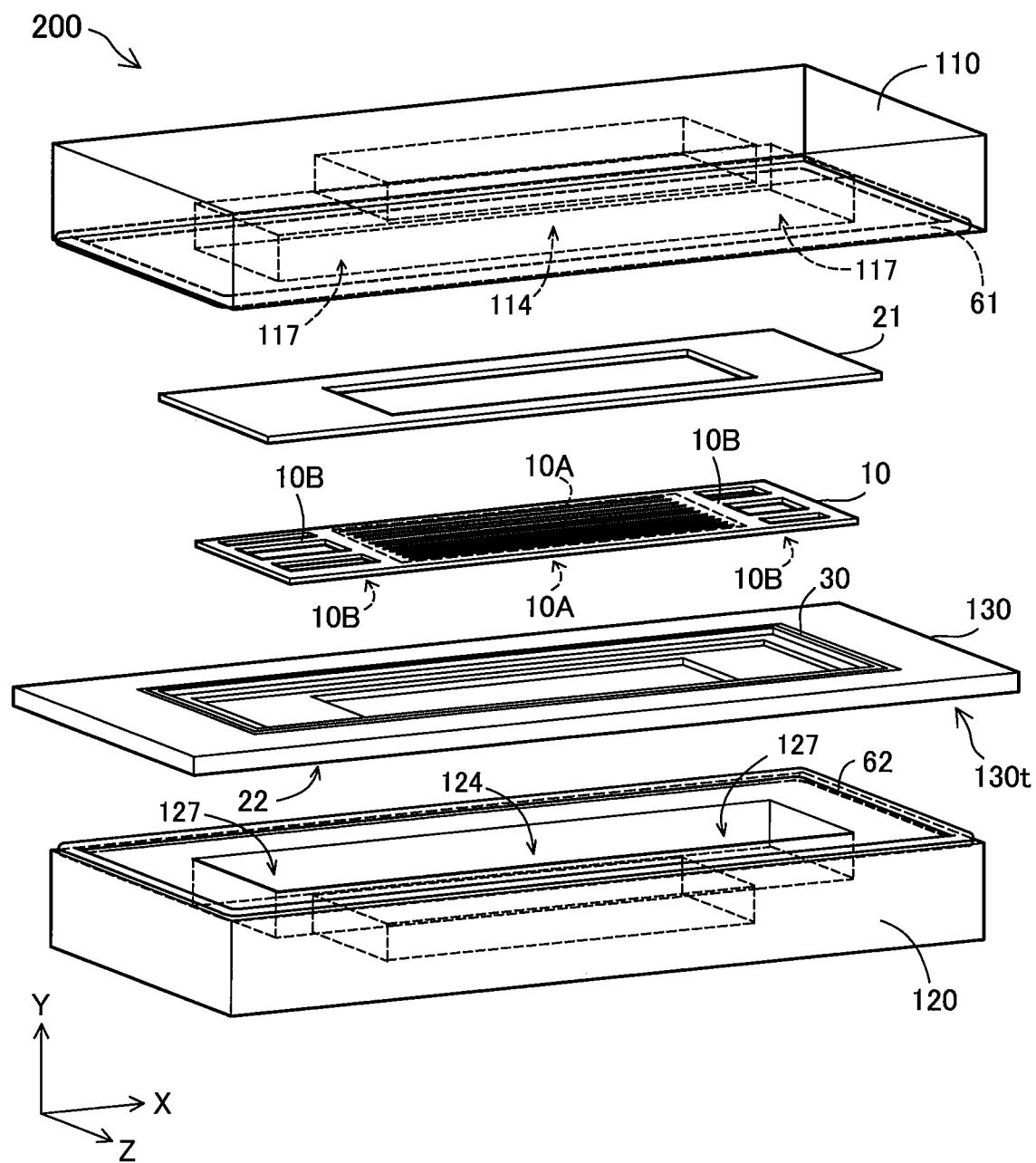
FIG. 2 is an exploded perspective view of the plasma device.

FIG. 1 is a schematic section view illustrating a configuration of a plasma device 200 according to the first embodiment of the disclosure. FIG. 2 is an exploded perspective view of the plasma device 200. FIG. 1 and FIG. 2 illustrate XYZ axes orthogonal to one another. The Y axis direction indicates a vertical direction. The X axis direction indicates a horizontal direction. The Z axis direction indicates a direction perpendicular to the Y axis and the X axis. This also applies to the subsequent drawings.

The plasma device 200 is a device that deposits a thin film on a part to be processed 10A of a work W having conductivity by a so-called plasma chemical vapor deposition (CVD) method. The work W includes an object to be processed 10 and a masking member 20. The object to be processed 10 includes the part to be processed 10A and a part not to be processed 10B. The part not to be processed 10B is disposed in a peripheral side of the object to be processed 10 relative to a part of the part to be processed 10A as viewed along a direction perpendicular to the object to be processed 10. More specifically, The part not to be processed 10B is disposed to surround the part to be processed 10A. In the present specification, "B surrounds A" means B is positioned relative to A so that two point included in B can be set such that a line connecting the two point crosses a part of A. The part to be processed 10A is a part on which a thin film is to be deposited by the plasma device 200, in a front surface and a back surface of the object to be processed 10. The part not to be processed 10B is a part on which a thin film is not to be deposited by the plasma device 200, in the front surface and the back surface of the object to be processed 10. The part not to be processed 10B is connected to the part to be processed 10A. In the first embodiment, the object to be processed 10 is a rectangular plate metal member used as a substrate of a separator of a fuel cell: a titanium (Ti) plate member, for example. However, the material of the object to be processed is not limited thereto, and may be aluminum (Al), stainless steel (SUS), or the like.

The masking member 20 is a plate member covering the front surface of the part not to be processed 10B and an end side surface of the work W. The masking member 20 is a plate member open on the part to be processed 10A of the object to be processed 10. The plasma device 200 forms a thin film (e.g., a conductive carbon thin film) only on the part to be processed 10A of the object to be processed 10 through the opening.

The plasma device 200 includes a vacuum vessel (chamber) 100, an insulation member 30, and a power application unit 70. The plasma device 200 further includes an opening/closing device 50, a conveyance device 55, a gas supply device 80, an exhaust device 90, a control unit 95, a pallet 130, and sealing members 61, 62. Note that FIG. 2 omits the illustration of the opening/closing device 50, the conveyance device 55, the power application unit 70 and a power introducing unit 71 thereof, the gas supply device 80 and a supply port 81 thereof, the exhaust device 90 and an exhaust port 91 thereof, and the control unit 95.

The vacuum vessel 100 is a dividable metal vessel. The vacuum vessel 100 includes a first mold 110 and a second mold 120 disposed facing the first mold 110. The first mold 110 includes, on the upper surface side of the work W, a first recessed portion 114 arranged facing the part to be processed 10A, a second recessed portion 117 arranged facing the part not to be processed 10B, and a facing plane portion 111 arranged facing a part of the outer periphery of the work W covered by the masking member 20 and the pallet 130 disposed to surround the work W (see FIG. 1).

The first recessed portion 114 and the second recessed portion 117 are recessed in a direction separating from the work W, and are recessed upward (+Y direction) relative to the upper surface of the work W in the first embodiment. The second recessed portion 117 has a smaller depth than the first recessed portion 114. That is, the second recessed portion 117 is recessed on the Y axis direction+side relative to the facing plane portion 111. The first recessed portion 114 is recessed on the Y axis direction+side relative to the second recessed portion 117. The facing plane portion 111 is a substantially plane region disposed at a position closer to the second mold 120 than the first recessed portion 114 and the second recessed portion 117.

The second recessed portion 117 is arranged to surround the first recessed portion 114. The facing plane portion 111 is arranged to surround the second recessed portion 117. The facing plane portion 111 is connected to the second recessed portion 117. The facing plane portion 111 is the portion to which the outer periphery of the work W is to be disposed facing. The first recessed portion 114 includes a side surface 112 and a bottom surface 113. The second recessed portion 117 includes a side surface 115 and a bottom surface 116. The side surface 112 of the first recessed portion 114 is connected to the bottom surface 116 of the second recessed portion 117. The side surface 115 of the second recessed portion 117 is connected to an end on the inner periphery side of the facing plane portion 111. Note that in the specification, a surface forming the inner wall on the side opposite to the opening is referred to as a "bottom surface" in the recessed portion.

The second mold 120 includes, on the lower surface side of the work W, a facing plane portion 121, a first recessed portion 124, and a second recessed portion 127 that are arranged substantially symmetrically to the facing plane portion 111, the first recessed portion 114, and the second recessed portion 117, respectively, of the first mold 110 (see FIG. 1). The facing plane portion 121 of the second mold 120 is parallel to the facing plane portion 111 of the first mold 110, and is parallel to an XZ plane in the first embodiment.

Moreover, the first recessed portion 124 and the second recessed portion 127 of the second mold 120 are recessed downward (−Y direction) relative to the part to be processed 10A on the lower side of the work W (see FIG. 1). The second recessed portion 127 has a smaller depth than the first recessed portion 124. The first recessed portion 124 includes a side surface 122 and a bottom surface 123. The second recessed portion 127 includes a side surface 125 and a bottom surface 126. The side surface 122 of the first recessed portion 124 is connected to the bottom surface 126 of the second recessed portion 127. The side surface 125 of the second recessed portion 127 is connected to an end on the inner periphery side of the facing plane portion 121.

In the following description, when the same components on the first mold 110 side and the second mold 120 side with the work W therebetween are distinguished particularly, "upper" may be added before a component on the first mold 110 side, and "lower" may be added before a component on the second mold 120 side. For example, the facing plane portion 111, the first recessed portion 114, and the second recessed portion 117 of the first mold 110 are also referred to as the upper facing plane portion 111, the upper first recessed portion 114, and the upper second recessed portion 117, respectively. The facing plane portion 121, the first recessed portion 124, and the second recessed portion 127 of the second mold 120 are also referred to as the lower facing plane portion 121, the lower first recessed portion 124, and the lower second recessed portion 127, respectively.

In the state where the work W is disposed in sealed space of the closed vacuum vessel 100, the work W is separate from the facing plane portions 111, 121. Moreover, the part to be processed 10A of the work W faces the space of the first recessed portions 114, 124. Moreover, the part not to be processed 10B faces the space of the second recessed portions 117, 127. An end forming the outer periphery of the part to be processed 10A is disposed in the space of the first recessed portions 114, 124. To be more specific, the end of the part to be processed 10A is disposed in the space of the first recessed portions 114, 124 defined by (i) two planes parallel to the ZY plane including the side surfaces 112, 122 of the first recessed portion 114, 124, (ii) one plane parallel to the XZ plane including the bottom surface 113 of the first recessed portion 114, (iii) one plane parallel to the XZ plane including the bottom surface 123 of the first recessed portion, and (iv) two planes parallel to the XY plane defining the first recessed portions 114, 124 (not illustrated in FIG. 1).

The first mold 110 and the second mold 120 include the supply port 81 for supplying gas into the vacuum vessel 100 from the gas supply device 80, and the exhaust port 91 for evacuating the vacuum vessel 100 by the exhaust device 90.

The supply port 81 and the exhaust port 91 are provided with an openable valve (not illustrated). Moreover, the second mold 120 includes the power introducing unit 71 for applying a voltage on the work W. An insulation member 35 electrically insulates the second mold 120 from the power introducing unit 71. In the first embodiment, the vacuum vessel 100 has an earth potential.

In the first embodiment, a part of the work W positioned in the first recessed portion 114, 124 does not have a hole penetrating the upper surface side and the lower surface side of the work W. However, such a part may have a hole penetrating the upper surface side and the lower surface side of the work W in the state where the vacuum vessel 100 is closed.

In the first embodiment, the masking member 20 includes an upper masking member 21 and a lower masking member 22. The upper masking member 21 is arranged on the first mold 110 side of the object to be processed 10. The lower masking member 22 is arranged on the second mold 120 side of the object to be processed 10. In the first embodiment, the lower masking member 22 supports the object to be processed 10. The masking member 20 is formed by a conductive member. The object to be processed 10 and the masking member 20 are electrically connected by contact with each other. Note that the member forming the masking member 20 (21, 22) includes titanium (Ti), aluminum (Al), stainless steel (SUS), or the like.

The insulation member 30 is arranged between the facing plane portion 111 of the first mold 110 and the second mold 120. In the first embodiment, the insulation member 30 is arranged between the facing plane portion 111 and the facing plane portion 121. The insulation member 30 is in contact with the work W in the state where the part to be processed 10A on the upper surface side of the work W is directed to the space in the upper first recessed portion 114, the part not to be processed 10B on the upper surface side of the work W is directed to the space in the upper second recessed portion 117, and the work W is separate from the facing plane portion 111. Moreover, in the first embodiment, the insulation member 30 is in contact with the work W in the state where the part to be processed 10A on the lower surface side of the work W is directed to the space in the lower first recessed portion 124, the part not to be processed 10B on the lower surface side of the work W is directed to the space in the lower second recessed portion 127, and the work W is separate from the facing plane portion 121. In the first embodiment, the insulation member 30 is in contact with the lower masking member 22 of the work W to support the lower masking member 22. The insulation member 30 is formed by ceramics such as alumina ($Al_2O_3$) or silicon dioxide ($SiO_2$).

The pallet 130 is a metal plate member. The pallet 130 is also a member that conveys the work W into the vacuum vessel 100. The insulation member 30, the lower masking member 22, the object to be processed 10, and the upper masking member 21 are stacked in this order in the +Y direction on the pallet 130 (see FIG. 1). In the first embodiment, the pallet 130 has an earth potential. Note that the metal member forming the pallet 130 includes titanium (Ti), aluminum (Al), stainless steel (SUS), or the like.

The sealing members 61, 62 are arranged between the facing plane portion 111 of the first mold 110 and the second mold 120. The sealing members 61, 62 are members for keeping airtightness in the vacuum vessel 100. The sealing members 61, 62 are insulating members, and are rubber annular members in the first embodiment. In the first embodiment, O-rings are used as the sealing members 61, 62. In the first embodiment, the sealing member 61 is fit in a groove provided on the first mold 110, and is disposed between the facing plane portion 111 of the first mold 110 and the pallet 130. The sealing member 62 is fit in a groove provided on the second mold 120, and is disposed between the facing plane portion 121 of the second mold 120 and the pallet 130.

The opening/closing device 50 is a device that opens and closes the vacuum vessel 100. In the first embodiment, the opening/closing device 50 moves the first mold 110 in the +Y direction to open the vacuum vessel 100, and moves the first mold 110 in the −Y direction to close the vacuum vessel 100.

The conveyance device 55 is a device that conveys the pallet 130 to the space between the first mold 110 and the second mold 120 of the vacuum vessel 100 (also referred to as "into the vacuum vessel 100" in the specification) and conveys the pallet 130 to the outside of the vacuum vessel 100. In the first embodiment, the conveyance device 55 is in contact with an end 130t of the pallet 130, and conveys the pallet 130 and the insulation member 30 and the work W (masking member 20, object to be processed 10) stacked on the pallet 130 into the vacuum vessel 100 (between the first mold 110 and the second mold 120) in the state where the vacuum vessel 100 is open. Moreover, the conveyance device 55 moves the conveyed pallet 130 downward to place the pallet 130 on the second mold 120 through the sealing member 62. Moreover, the conveyance device 55 is also able to move the upwardly moved pallet 130 along the XZ plane to convey it to the outside of the vacuum vessel 100.

The power application unit 70 is a device for generating plasma. The power application unit 70 applies DC power on the work W. The power application unit 70 generates an electric field for converting raw material gas supplied in the vacuum vessel 100 into plasma. In the first embodiment, the power introducing unit 71, the object to be processed 10, and the masking member 20 are cathodes, while the first mold 110, the second mold 120, and the pallet 130 are anodes. In the first embodiment, the power application unit 70 applies a bias voltage on the object to be processed 10 through the lower masking member 22. The power application unit 70 is able to apply a voltage of −3000V on the power introducing unit 71, for example. Note that the vacuum vessel 100 and the pallet 130 are connected to an earth (OV) in the first embodiment.

The gas supply device 80 supplies carrier gas and raw material gas into the vacuum vessel 100 through the supply port 81. In the first embodiment, the gas supply device 80 supplies nitrogen ($N_2$) gas or argon (Ar) gas, for example, as carrier gas, and supplies pyridine ($C_5H_5N$) gas, for example, as raw material gas. The gas supply device 80 is connected to a plurality of tanks storing different kinds of gas. The gas supply device 80 is able to switch the kind of gas supplied to the supply port 81 by operation of a switching valve provided between each tank and the supply port 81. Moreover, the gas supply device 80 supplies nitrogen gas, for example, into the vacuum vessel 100 after film disposition or etching by the plasma device 200 so as to restore a voltage in the vacuum vessel 100 allowing the opening/closing device 50 to open the vacuum vessel 100.

The exhaust device 90 evacuates the vacuum vessel 100 through the exhaust port 91. The exhaust device 90 is formed by a rotary pump, a diffuser pump, a turbomolecular pump, or the like, for example.

The control unit 95 controls the entire operation of the plasma device 200. The control unit 95 includes a CPU and a memory. The CPU executes a program stored in the memory to control plasma processing by the plasma device 200. The program may be recorded in various recording media. For example, the control unit 95 controls the opening/closing device 50 to open and close the vacuum vessel 100, and controls the conveyance device 55 to convey the pallet 130. Moreover, the control unit 95 controls the exhaust device 90 to evacuate the vacuum vessel 100, controls the gas supply device 80 to supply gas into the vacuum vessel 100, and controls the power application unit 70 to apply power on the work W.

Figure 3:
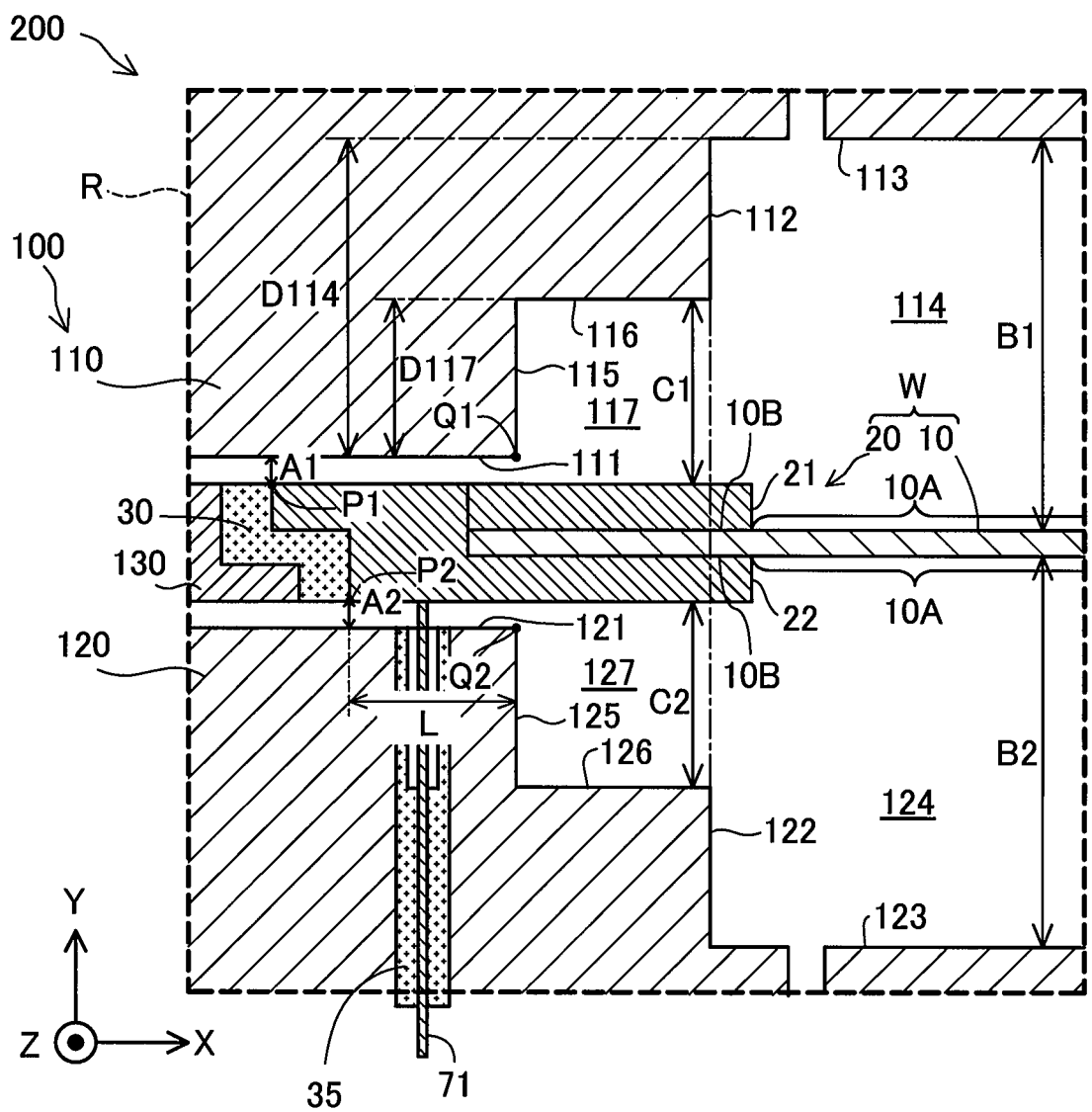
FIG. 3 is a partial enlarged view of the plasma device.

FIG. 3 is a partial enlarged view of the plasma device 200. FIG. 3 illustrates an R part illustrated with a broken line in FIG. 1. FIG. 3 illustrates a contact point P1 between the work W and the insulation member 30 and a contact point P2 between the work W and the insulation member 30. The contact point P1 is a portion facing the upper facing plane portion 111 in the part where the work W and the insulation member 30 are in contact with each other. The contact point P1 is a contact portion closest to the upper facing plane portion 111 in the part where the work W and the insulation member 30 are in contact with each other in a section of the plasma device 200 (see FIG. 3). The contact point P2 is a portion facing the lower facing plane portion 121 in the part where the work W and the insulation member 30 are in contact with each other. The contact point P2 is a contact portion closest to the lower facing plane portion 121 in the part where the work W and the insulation member 30 are in contact with each other in a section of the plasma device 200 (see FIG. 3).

FIG. 3 illustrates a depth D114 of the upper first recessed portion 114 and a depth D117 of the upper second recessed portion 117. The depth D114 is a distance (gap) between a plane facing the work W in the upper facing plane portion 111 and the bottom surface 113 of the upper first recessed portion 114. The depth D117 is a distance (gap) between a plane facing the work W of the upper facing plane portion 111 and the bottom surface 116 of the upper second recessed portion 117. The depth D114 is set to a size allowing generation of plasma in the first recessed portion 114. The depth D117 is also set to a size allowing generation of plasma in the second recessed portion 117. However, D114>D117 is set in this example. The depth of the lower first recessed portion 124 and the depth of the lower second recessed portion 127 are also set in the same manner although the illustration and description thereof are omitted.

FIG. 3 further illustrates a distance A1 between the contact point P1 and the upper facing plane portion 111, a distance B1 between the work W and the bottom surface 113 of the upper first recessed portion 114, and a distance C1 between the work W and the bottom surface 116 of the upper second recessed portion 117. The distance A1 is a smallest distance from the contact portion between the work W and the insulation member 30 to the upper facing plane portion 111. The distance B1 is a distance between the work W facing the upper first recessed portion 114 and the bottom surface 113 of the upper first recessed portion 114, and is a smallest distance between the bottom surface 113 of the upper first recessed portion 114 and the work W. The distance C1 is a distance between the work W facing the upper second recessed portion 117 and the bottom surface 116 of the upper second recessed portion 117, and is a smallest distance between the bottom surface 116 of the upper second recessed portion 117 and the work W.

Moreover, FIG. 3 illustrates a distance A2 between the contact point P2 and the lower facing plane portion 121, a distance B2 between the work W and the bottom surface 123 of the lower first recessed portion 124, and a distance C2 between the work W and the bottom surface 126 of the lower second recessed portion 127. The distance A2 is a smallest distance from the contact portion between the work W and the insulation member 30 to the lower facing plane portion 121. The distance B2 is a distance between the work W facing the lower first recessed portion 124 and the bottom surface 123 of the lower first recessed portion 124, and is a smallest distance between the bottom surface 123 of the lower first recessed portion 124 and the work W. The distance C2 is a distance between the work W facing the lower second recessed portion 127 and the bottom surface 126 of the lower second recessed portion 127, and is a smallest distance between the bottom surface 126 of the lower second recessed portion 127 and the work W.

The distance B1 is sufficiently larger than a distance (thickness) of a sheath formed by a voltage applied between the bottom surface 113 of the upper first recessed portion 114 and the work W, and is set to a size allowing plasma to be generated sufficiently in the space of the upper first recessed portion 114. The distance C1 is smaller than the distance B1. However, the distance C1 is sufficiently larger than a distance (thickness) of a sheath formed by a voltage applied between the bottom surface 116 of the upper second recessed portion 117 and the work W, and is set to a size allowing plasma to be generated sufficiently in the space of the upper second recessed portion 117.

Similarly to the distance B1, the distance B2 is sufficiently larger than a distance (thickness) of a sheath formed by a voltage applied between the bottom surface 123 of the lower first recessed portion 124 and the work W, and is set to a size allowing plasma to be generated sufficiently in the space of the lower first recessed portion 124. Similarly to the distance C1, the distance C2 is also smaller than the distance B2. However, the distance C2 is sufficiently larger than a distance (thickness) of a sheath formed by a voltage applied between the bottom surface 126 of the lower second recessed portion 127 and the work W, and is set to a size allowing plasma to be generated sufficiently in the space of the lower second recessed portion 127.

In the plasma device 200, the distance A1 is smaller than the distances B1, C1. In other words, the space formed by the work W and the upper facing plane portion 111 is smaller in depth than the space formed by the work W and the upper first recessed portion 114, and the space formed by the work W and the upper second recessed portion 117. Moreover, the distance A1 is smaller than a distance of a sheath formed by a voltage applied between the upper facing plane portion 111 and the work W, and is set to a size suppressing generation of plasma.

Similarly to the distance A1, the distance A2 is also smaller than the distances B2, C2. In other words, the space formed between the work W and the lower facing plane portion 121 is smaller than the space formed by the work W and the lower first recessed portion 124 and the space formed by the work W and the lower second recessed portion 127. Moreover, similarly to the distance A1, the distance A2 is smaller than a distance of a sheath formed by a voltage applied between the lower facing plane portion 121 and the work W, and is set to a size suppressing generation of plasma.

In the first embodiment, the distance (gap) A1 and the distance (gap) A2 are smaller than a distance (thickness) of a sheath formed between the work W and the vacuum vessel 100 (upper facing plane portion 111, lower facing plane portion 121) when power is applied between the work W and the vacuum vessel 100. In the first embodiment, the distance A1 and the distance A2 are equal to or smaller than 2.0 mm.

Note that in the view of keeping insulation between the vacuum vessel 100 and the work W, the distance A1 and the distance A2 are preferably equal to or larger than 0.5 mm.

FIG. 3 further illustrates the smallest distance L in a distance along the X axis from a connecting portion Q1 between the upper second recessed portion 117 and the upper facing plane portion 111 to the contact point P1 and a distance along the X axis from a connecting portion Q2 between the lower second recessed portion 127 and the lower facing plane portion 121 to the contact point P2. The distance L is also a smallest distance in a distance along the X axis from the side surface 115 of the upper second recessed portion 117 to the contact point P1 and a distance along the X axis from the side surface 125 of the lower second recessed portion 127 to the contact point P2. The distance L is set to a value larger than 0 (zero). The contact points P1, P2 are arranged at positions separate by the distance L from the side surface 115 of the upper second recessed portion 117 and the side surface 125 of the lower second recessed portion 127. As a result, the contact points P1, P2, and the contact portion between the power introducing unit 71 and the masking member 20 are arranged between the upper facing plane portion 111 and the lower facing plane portion 121. In the first embodiment, the distance L is set to a value equal to or larger than 10 mm.

Figure 4:
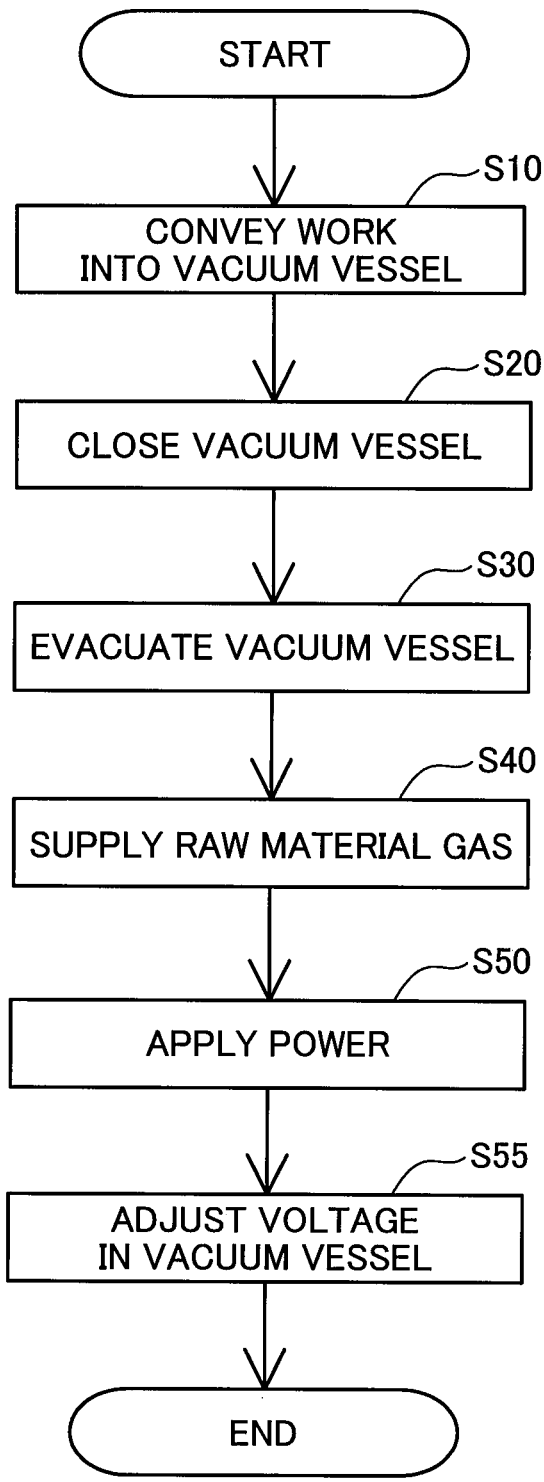
FIG. 4 is a flowchart illustrating an example of plasma processing method by the plasma device.

FIG. 4 is a flowchart illustrating an example of a plasma processing method by the plasma device 200. The following exemplifies the method of depositing a film on a part of the work W by the plasma device 200. Once the control unit 95 controls the plasma device 200 to start film deposition processing, the work W is first conveyed into the vacuum vessel 100 (Step S10). In the first embodiment, the opening/closing device 50 moves the first mold 110 of the vacuum vessel 100 in the +Y axis direction, so that the conveyance device 55 conveys the pallet 130 on which the insulation member 30 and the work W (masking member 20, object to be processed 10) are stacked into the vacuum vessel 100 (between the first mold 110 and the second mold 120). The conveyed pallet 130 is arranged on the second mold 120 through the sealing member 62.

Next, the vacuum vessel 100 is closed (Step S20). In the first embodiment, the pallet 130 is conveyed into the vacuum vessel 100 (between the first mold 110 and the second mold 120), and then the opening/closing device 50 moves the first mold 110 in the −Y axis direction. Once the vacuum vessel 100 is closed, the part to be processed 10A is directed to the space in the first recessed portions 114, 124 and the second recessed portions 117, 127 of the vacuum vessel 100. The work W is separate from the facing plane portions 111, 121, and is sealed in the vacuum vessel 100.

Next, gas in the vacuum vessel 100 is evacuated (Step S30). In the first embodiment, the plasma device 200 is disposed in a nitrogen gas atmosphere, for example. At Step S30, the exhaust device 90 exhausts nitrogen gas in the vacuum vessel 100 through the exhaust port 91 to evacuate the vacuum vessel 100.

Once the gas in the vacuum vessel 100 is evacuated, raw material gas is supplied into the vacuum vessel 100 (Step S40). At Step S40, the gas supply device 80 supplies carrier gas and raw material gas through the supply port 81. Hydrogen gas and argon gas, for example, are supplied as carrier gas into the vacuum vessel 100. Moreover, nitrogen gas and pyridine gas, for example, are supplied as raw material gas. At Step S40, a voltage value in the vacuum vessel 100 is 11 Pa, for example.

Next, power is applied on the work W (Step S50). Once the power application unit 70 applies power between the work W and the vacuum vessel 100, plasma is generated in the first recessed portions 114, 124 and the second recessed portions 117, 127, forming a thin film on the part to be processed 10A of the object to be processed 10. In such a manner, the plasma device 200 deposits a film. At Step S50, the power application unit 70 applies power (DC power) of −3000V, for example, on the work W. Once Step S50 is finished, the supply of raw material gas and the application of power are stopped, and the film disposition is finished.

Once the film disposition is finished, a voltage in the vacuum vessel 100 is adjusted (Step S55). In the first embodiment, the gas supply device 80 supplies nitrogen gas into the vacuum vessel 100 in order to restore a voltage in the vacuum vessel 100 allowing the opening/closing device 50 to open the vacuum vessel 100. Note that once the voltage in the vacuum vessel 100 is adjusted, the opening/closing device 50 moves the first mold 110 in the +Y axis direction, so that the conveyance device 55 conveys the pallet 130 on which the insulation member 30 and the work W (masking member 20, object to be processed 10) are stacked from the vacuum vessel 100. In such a manner, a series of plasma processing method by the plasma device 200 is finished.

Here, the portion on which a thin film is to be deposited by generating plasma is only the part to be processed 10A of the object to be processed 10. Thus, there is no need to generate plasma in the space in which the part not to be processed 10B on which film deposition is not necessary is arranged. To improve the efficiency of various processing in film deposition, such as the increase of a film deposition speed and the suppression of an amount of gas to be supplied, the space in the vacuum vessel 100 is preferably small. In view of these aspects, there is supposed, for the vacuum vessel, the structure in which the facing plane portions 111, 121 are connected to the first recessed portions 114, 124 without the second recessed portions 117, 127 (see FIG. 1, FIG. 3). However, as described above, the gaps A1, A2 of the space between the facing plane portions 111, 121 and the work W are set to be smaller than a distance of a sheath formed therebetween. Thus, plasma is not generated in the gaps. Moreover, entering of plasma from the first recessed portions 114, 124 is also suppressed, as described later. In this manner, when the part not to be processed 10B is disposed facing the facing plane portions 111, 121, the increase of a temperature due to heat from plasma is suppressed at the masking member 20 covering the part not to be processed 10B and the part not to be processed 10B covered by the masking member 20. This makes the temperature of the part not to be processed 10B lower than that of the part to be processed 10A. Such a temperature difference becomes larger than a plastic deformation occurrence temperature difference, which causes, with high possibility, plastic deformation such as warping and waviness of the object to be processed 10 after film deposition.

Meanwhile, the plasma device 200 of the first embodiment includes the second recessed portions 117, 127 arranged facing the part not to be processed 10B, as described above. The space of the second recessed portions 117, 127 is set to a depth necessary for converting raw material gas supplied through the first recessed portions 114, 124 into plasma state. In this manner, it is possible to add heat to the masking member 20 arranged facing the second recessed portions 117, 127, and the part not to be processed 10B covered by the masking member 20 directly from plasma generated in the second recessed portions 117, 127. This enables suppression of a temperature difference between the part not to be processed 10B and the part to be processed 10A. Then, it is possible to decrease a temperature gradient at a boundary between the part not to be processed 10B and the part to be processed 10A. This may suppress occurrence of plastic deformation of the object to be processed 10 after film deposition. The space of the second recessed portions 117, 127 is set to a depth necessary for converting raw material gas supplied through the first recessed portions 114, 124 into plasma state, and a depth different from that of the space of the first recessed portions 114, 124.

Note that the heat amount from plasma added to the part not to be processed 10B varies in accordance with an amount of plasma generated in the second recessed portions 117, 127. Therefore, the heat amount is larger with larger space of the second recessed portions 117, 127, that is, larger depth of the second recessed portions 117, 127, which enables suppression of a temperature difference between the part not to be processed 10B and the part to be processed 10A. However, the arrangement of the second recessed portions 117, 127 expands inner space of the vacuum vessel 100. Thus, in the form with a larger depth of the second recessed portions 117, 127, there are caused the increase of time for exhausting gas in space to a vacuum state, the increase of an amount of gas supplied into the space, the increase of time for supplying the gas, and the like. Therefore, it is preferable to make the second recessed portions 117, 124 as small as possible in the range of a size fulfilling a deformation amount allowed for the object to be processed 10 after film deposition.

Then, in the first embodiment, the second recessed portions 117, 127 are set to a depth different from the first recessed portions 114, 124. The depth of the second recessed portions 117, 127 may be set to an appropriate value by preliminarily finding, by an experiment, conditions in which a temperature difference between the part not to be processed 10B and the part to be processed 10A is within an allowable temperature difference. Note that in the first embodiment, as shown in FIG. 3, the distances C1, C2 between the work W and the bottom surfaces 116, 126 of the second recessed portions 117, 127 are set to be smaller than the distances B1, B2 between the work W and the bottom surfaces 113, 123 of the first recessed portions 114, 124. That is, the depth of the second recessed portions 117, 127 is set to be smaller than the depth of the first recessed portions 114, 124. With such a setting, it is possible to suppress as much as possible the increase of time for evacuation and the increase of time for supplying gas due to the arrangement of the second recessed portions 117, 127.

As described above, in the plasma device 200 of the first embodiment, it is possible to generate plasma in the second recessed portions 117, 127 arranged facing the part not to be processed 10B of the object to be processed 10 and add heat to the masking members 20 and the part not to be processed 10B covered by the masking member 20 directly from plasma. In this manner, it is possible to suppress a temperature difference between the part not to be processed 10B and the part to be processed 10A, which enables suppression of occurrence of plastic deformation of the object to be processed 10 after film deposition.

Moreover, when a separator with a deformation amount larger than an allowable value is used for a fuel cell, the deformation of the fuel cell causes a divergence between a plurality of fuel cells when they are stacked, which deteriorates power generation performance. Meanwhile, using a separator with plastic deformation suppressed by the plasma device 200 of the first embodiment for a fuel cell, it is possible to suppress a divergence between a plurality of fuel cells caused when they are stacked, and suppress deterioration of power generation performance.

Moreover, in the state where the vacuum vessel 100 is closed, the insulation member 30 in contact with the work W is arranged between the upper facing plane portion 111 of the first mold 110 and the lower facing plane portion 121 of the second mold 120, as illustrated in FIG. 3. The distance A1 from the contact point P1 between the work W and the insulation member 30 to the upper facing plane portion 111 is smaller than the distance B1 between the work W and the bottom surface 113 of the upper first recessed portion 114, and the distance C1 (<B1) between the work W and the bottom surface 116 of the upper second recessed portion 117. Thus, it is possible to suppress entering of plasma generated in the upper first recessed portion 114, the upper second recessed portion 117, the lower first recessed portion 124, and the lower second recessed portion 127 into the space formed by the work W and the upper facing plane portion 111. In this manner, the amount of plasma at the contact point P1 is reduced, which enables suppression of occurrence of abnormal discharge.

Similarly, the distance A2 from the contact point P2 between the work W and the insulation member 30 to the lower facing plane portion 121 is smaller than the distance B2 between the work W and the bottom surface 123 of the lower first recessed portion 124, and the distance C2 (<B2) between the work W and the bottom surface 126 of the lower second recessed portion 127. Thus, it is possible to suppress entering of plasma generated in the lower first recessed portion 124, the lower second recessed portion 127, the upper first recessed portion 114, and the upper second recessed portion 117 into the space formed by the work W and the lower facing plane portion 121. In this manner, the amount of plasma at the contact point P2 is reduced, which enables suppression of occurrence of abnormal discharge.

Moreover, the distance L along the X axis from the connecting portion Q1 between the upper second recessed portion 117 and the upper facing plane portion 111 and the connecting portion Q2 between the lower second recessed portion 127 and the lower facing plane portion 121 to the insulation member 30 is larger than 0 (zero). Thus, the space formed by the first recessed portions 114, 124 and the second recessed portions 117, 127 where plasma is generated is separate from the contact points P1, P2 between the work W and the insulation member 30. Therefore, the amount of plasma at the contact points P1, P2 is further reduced. As a result, it is possible to further suppress occurrence of abnormal discharge at the contact points P1, P2 between the work W and the insulation member 30.

Moreover, the distance A1 from the contact point P1 between the work W and the insulation member 30 to the upper facing plane portion 111 is smaller than a distance (thickness) of a sheath formed between the work W and the upper facing plane portion 111. This prevents generation of plasma between the work W and the upper facing plane portion 111. Moreover, the distance A2 from the contact point P2 between the work W and the insulation member 30 to the lower facing plane portion 121 is smaller than a distance (thickness) of a sheath formed between the work W and the facing plane portion 121. This prevents generation of plasma between the work W and the facing plane portion 121. In this manner, the amount of plasma at the contact points P1, P2 is reduced effectively, which enables effective suppression of occurrence of abnormal discharge.

Moreover, the distance A1 and the distance A2 are equal to or smaller than 2.0 mm. This further suppresses entering of plasma into the space formed by the work W and the upper facing plane portion 111 and the space formed by the work W and the lower facing plane portion 121 from the first recessed portions 114, 124 and the second recessed portions 117, 127. Furthermore, it is possible to prevent generation of plasma between the work W and the facing plane portions 111, 121. In this manner, the amount of plasma at the contact points P1, P2 is further reduced, which enables further suppression of occurrence of abnormal discharge.

Moreover, in the plasma device 200, the part to be processed 10A of the work W is directed to the space in the first recessed portions 114, 124, and the insulation member 30 and the end of the work W are positioned between the upper facing plane portion 111 and the lower facing plane portion 121. Thus, it is possible to downsize the plasma device 200 as compared with the case in which the whole work W is stored in space where plasma is generated. Moreover, in the plasma device 200, the space for evacuation for film deposition is small. Thus, it is possible to reduce time for evacuation, which reduces time required to deposit a film on the work W.

Note that in the above-described first embodiment, the plasma device 200 deposits a film on a part of the work W. Meanwhile, the plasma device 200 may perform plasma processing for etching on a part of the work W. When etching is performed, gas mainly containing argon, for example, may be supplied into the vacuum vessel 100 in the step of supplying gas (Step S40 in FIG. 4) in the above-described plasma processing.

B. Second Embodiment

Figure 5:
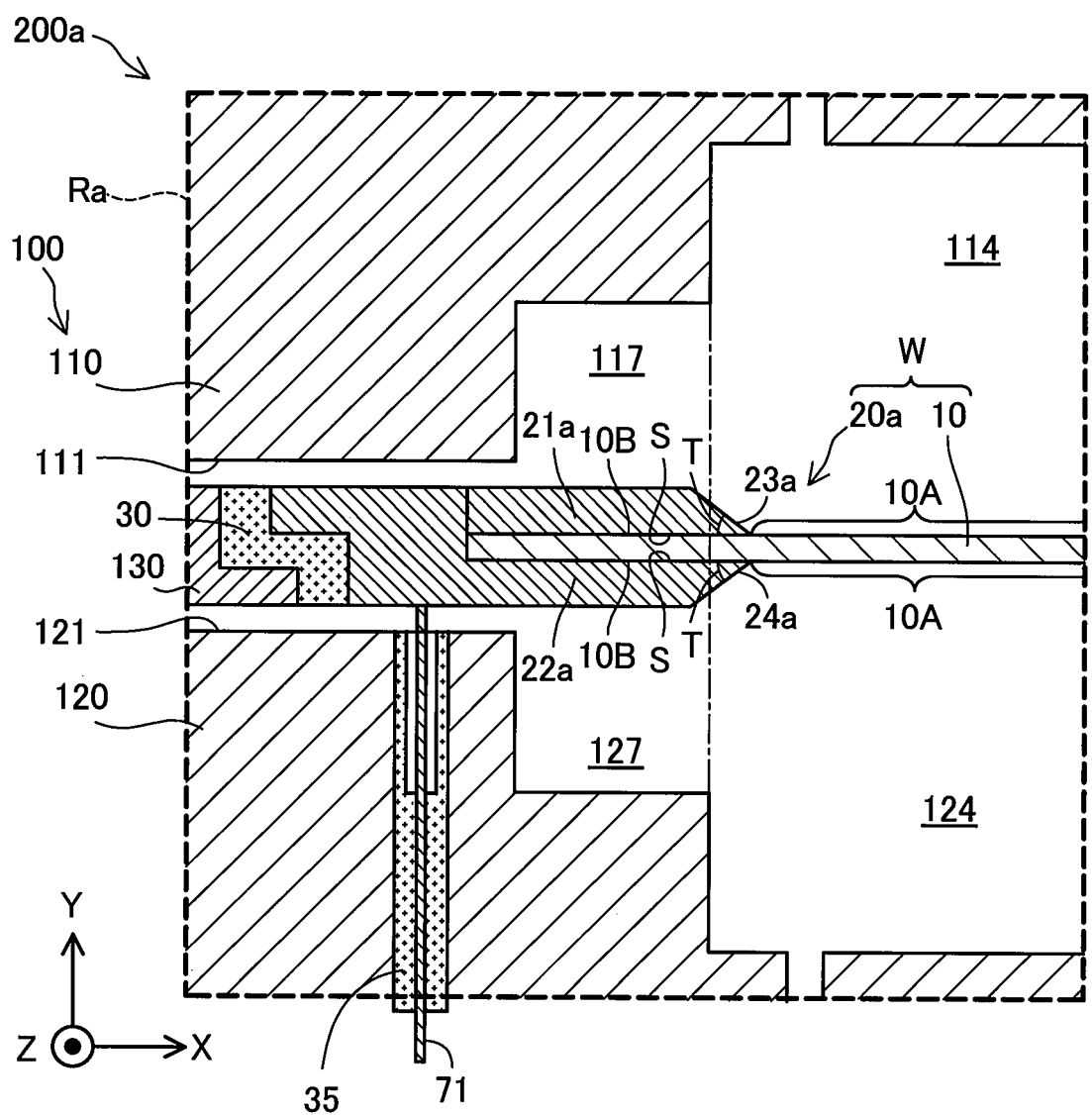
FIG. 5 is a partial schematic section view partially illustrating a configuration of a plasma device according to a second embodiment.

FIG. 5 is a partial schematic section view partially illustrating a configuration of a plasma device 200a in the second embodiment. FIG. 5 illustrates a part Ra corresponding to the R part of FIG. 1. A difference between the plasma device 200a of the second embodiment and the plasma device 200 of the first embodiment lies in that a masking member 20a (21a, 22a) has inclined surfaces 23a, 24a. To be more specific, the upper masking member 21a has the inclined surface 23a inclined toward the upper first recessed portion 114 at the end of the part to be processed 10A. Moreover, the lower masking member 22a has the inclined surface 24a inclined toward the lower first recessed portion 124 at the end of the part to be processed 10A. The inclined surfaces 23a, 24a are surfaces inclined relative to a contact surface S in contact with the part not to be processed 10B in the masking member 20a (21a, 22a). In the second embodiment, the inclined surfaces 23a, 24a are in contact with the end of the part to be processed 10A. Other configurations of the plasma device 200a of the second embodiment are same as those of the plasma device 200 of the first embodiment. Thus, the description thereof is omitted.

In the plasma device 200a of the second embodiment, the upper masking member 21a in contact with the part to be processed 10A has the inclined surface 23a inclined toward the side of the upper first recessed portion 114, which enables suppression of concentration of an electric field on the end of the upper masking member 21a. Therefore, it is possible to suppress reduction of film density or etching density at the end of the part to be processed 10A on the upper surface side of the work W. Moreover, the lower masking member 22a has the inclined surface 24a inclined toward the side of the lower first recessed portion 124, which enables suppression of concentration of an electric field on the end of the lower masking member 22a. Therefore, it is possible to suppress reduction of film density or etching density at the end of the part to be processed 10A on the lower surface side of the work W.

Note that from a viewpoint of further suppressing reduction of film density or etching density at the end of the part to be processed 10A, an angle T that is an angle formed by the inclined surfaces 23a, 24a and the contact surface S is preferably equal to or smaller than 30°. Note that in the upper masking member and the lower masking member, the inclined surfaces 23a, 24a may not be in direct contact with the part to be processed 10A, and there may be provided a vertical surface (along the Y-direction) connecting the ends of the inclined surfaces 23a, 24a and the part to be processed 10A. Also in such a form, it is possible to suppress concentration of an electric field on the end of the upper masking member 21a and the end of the lower masking member 22a. Therefore, it is possible to suppress reduction of film density or etching density at the ends of the part to be processed 10A on the upper surface side and the lower surface side of the work W.

C. Third Embodiment

Figure 6:
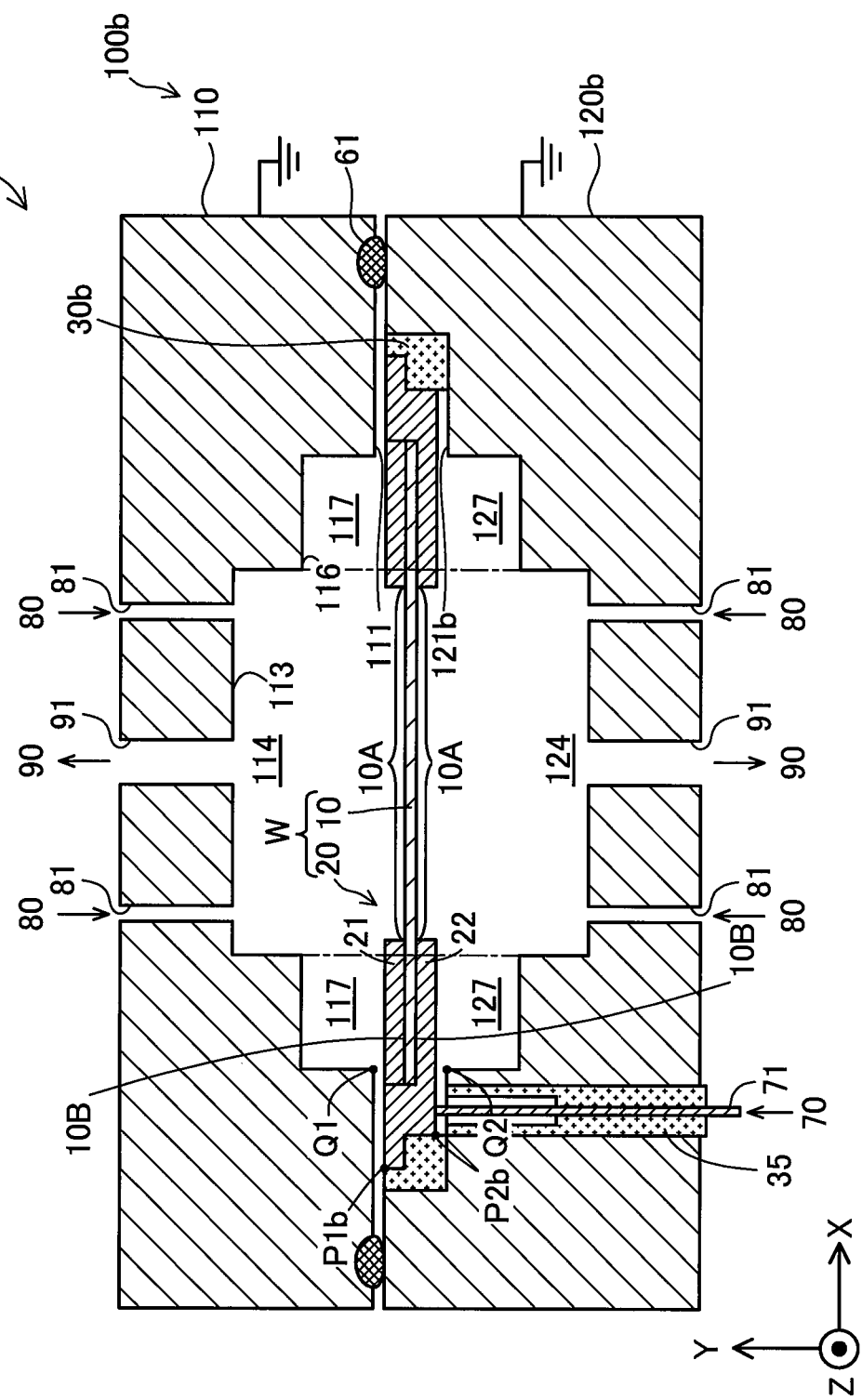
FIG. 6 is a diagram illustrating a plasma device according to a third embodiment.

FIG. 6 is a diagram illustrating a plasma device 200b in the third embodiment. A main difference between the plasma device 200b and the plasma device 200 of the above-described first embodiment (see FIG. 1) lies in that the work W is disposed without using the pallet 130. Thus, in the plasma device 200b, a facing plane portion 121b of a second mold 120b is in contact with an insulation member 30b, while the work W is separate from a second 120c in a vacuum vessel 100b. Moreover, similarly to the plasma device 200 of the first embodiment, the plasma device 200b includes the opening/closing device 50, the conveyance device 55, the power application unit 70, the gas supply device 80, the exhaust device 90, and the control unit 95. However, the illustration thereof is omitted for convenience in illustration.

Note that similarly to the above-described first embodiment, also in the third embodiment, the distance from a contact point P1b between the work W and the insulation member 30b to the upper facing plane portion 111 is smaller than the distance between the work W and the bottom surface 116 of the upper second recessed portion 117. Moreover, the distance from a contact point P2b between the work W and the insulation member 30b and the lower facing plane portion 121b is smaller than the distance between the work W and the bottom surface 126 of the lower second recessed portion 127. In addition, the distances along the X axis from the connecting portion Q1 between the upper second recessed portion 117 and the upper facing plane portion 111 and the connection portion Q2 between the lower second recessed portion 127 and the lower facing plane portion 121 to the contact points P1b, P2b are set to a value larger than 0 (zero). As a result, the contact points P1b, P2b, and the contact portion between the power introducing unit 71 and the masking member 20 are arranged between the upper facing plane portion 111 and the lower facing plane portion 121. Note that other configurations of the third embodiment are same as those of the above-described first embodiment.

The plasma device 200b is also able to suppress occurrence of plastic deformation, similarly to the first embodiment. Moreover, it is possible to suppress occurrence of abnormal discharge in the plasma device 200b.

D. Fourth Embodiment

Figure 7:
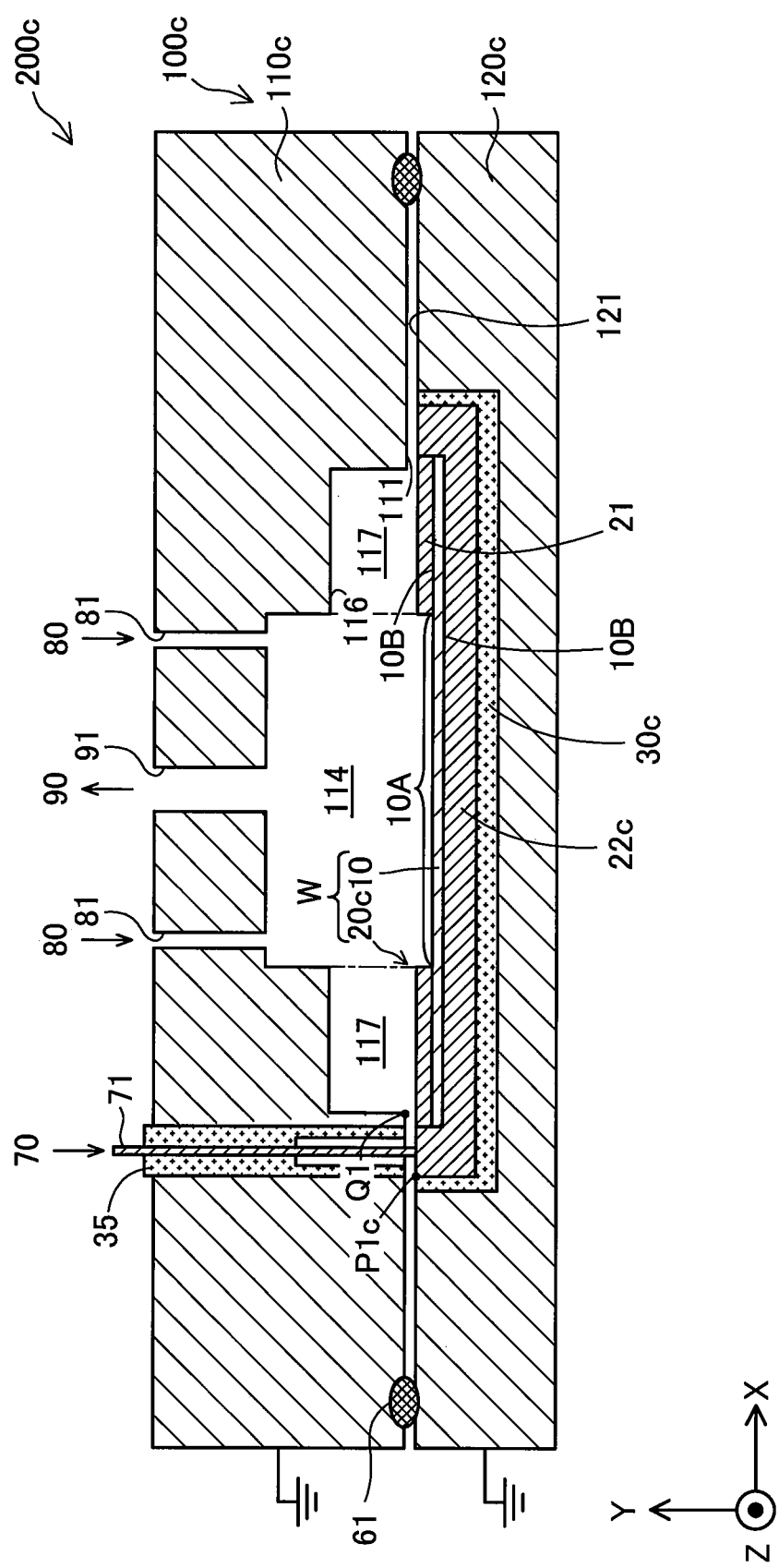
FIG. 7 is a diagram illustrating a plasma device according to a fourth embodiment.

FIG. 7 is a diagram illustrating a plasma device 200c in the fourth embodiment. The plasma device 200c performs plasma processing for film disposition or etching only on the first recessed portion 114 side of the object to be processed 10, unlike the plasma device 200 of the first embodiment (see FIG. 1). Thus, the plasma device 200c does not have space between a second mold 120c of a vacuum vessel 100c and the object to be processed 10. An insulation member 30c is in contact with the second mold 120c. A lower masking member 22c is in contact with the insulation member 30c. The entire of a lower surface of the object to be processed 10 is in contact with the lower masking member 22c. Moreover, the plasma device 200c does not include the pallet 130 on which the work W is placed. Moreover, the plasma device 200c includes the power introducing unit 71 on the first mold 110c side instead of the second mold 120 side. Similarly to the plasma device 200 of the first embodiment, the plasma device 200c includes the opening/closing device 50, the conveyance device 55, the power application unit 70, the gas supply device 80, the exhaust device 90, and the control unit 95. However, the illustration thereof is omitted for convenience in illustration.

Similarly to the above-described first embodiment, also in the fourth embodiment, the distance from a contact point P1c between the work W and an insulation member 30c to the upper facing plane portion 111 is smaller than the distance between the work W and the bottom surface 116 of the upper second recessed portion 117. In addition, the distance along the X axis from the connecting portion Q1 between the upper second recessed portion 117 and the upper facing plane portion 111 to the contact point P1c is set to a value larger than 0 (zero). As a result, the contact point P1c and the contact portion between the power introducing unit 71 and the masking member 20c are arranged at positions facing the upper facing plane portion 111. Note that other configurations of the fourth embodiment are same as those of the above-described first embodiment.

The plasma device 200c is also able to suppress occurrence of plastic deformation of the object to be processed 10, similarly to the first embodiment. Moreover, it is possible to suppress occurrence of abnormal discharge in the plasma device 200c.

E. Fifth Embodiment

Figure 8:
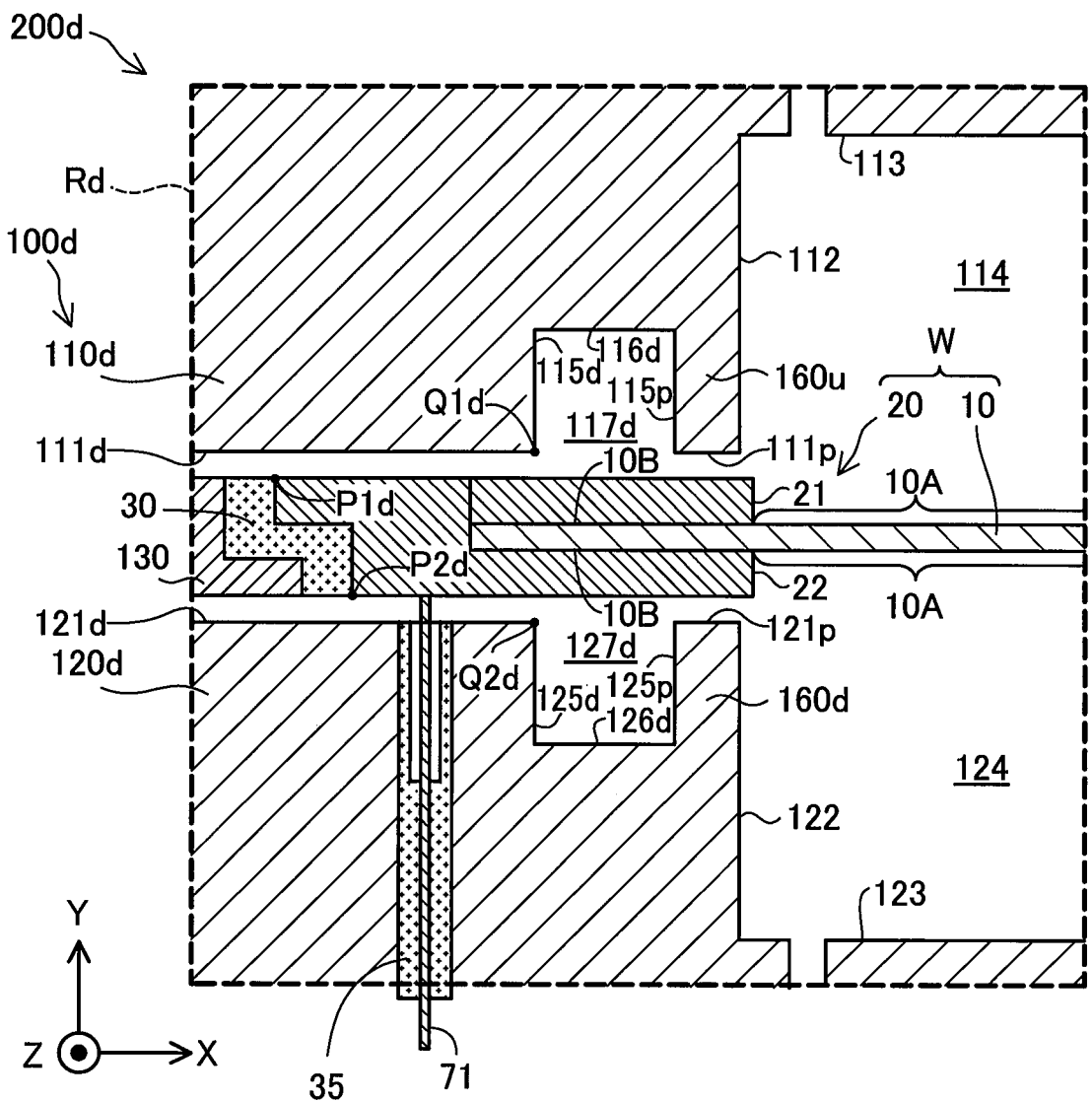
FIG. 8 is a partial schematic section view partially illustrating a configuration of a plasma device according to a fifth embodiment.

FIG. 8 is a partial schematic section view partially illustrating a configuration of a plasma device 200d in the fifth embodiment. FIG. 8 illustrates a part Rd corresponding to the R part of FIG. 1. A difference between the plasma device 200d of the fifth embodiment and the plasma device 200 of the first embodiment lies in that second recessed portions 117d, 127d are arranged on the outer surroundings of the first recessed portions 114, 124 through partition walls 160u, 160d.

The partition wall 160u between the upper second recessed portion 117d and the upper first recessed portion 114 includes the side surface 112 of the upper first recessed portion 114, an inner side surface 115p of the upper second recessed portion 117d, and a plane surface 111p. The plane surface 111p is connected to the side surface 112 and the side surface 115p, and is a surface on the XZ plane that is same as a plane surface facing the work W of the upper facing plane portion 111d. Moreover, the partition wall 160d between the lower second recessed portion 127d and the lower first recessed portion 124 includes the side surface 122 of the lower first recessed portion 124, an inner side surface 125p of the lower second recessed portion 127d, and a plane surface 121p. The plane surface 121p is connected to the side surface 122 and the side surface 125p, and is a surface on the XZ plane that is same as a plane surface facing the work W of the lower facing plane portion 121d.

The plane surface 111p of the upper partition wall 160u is arranged to be separate in the +Y direction from the facing work W (upper masking member 21), similarly to the upper facing plane portion 111d. The gap between the plane surface 111p of the upper partition wall 160u and the work W is smaller than the gap between the bottom surface 116d of the upper second recessed portion 117d and the upper masking member 21, and forms a communication path between the upper first recessed portion 114 and the upper second recessed portion 117d.

The plane surface 121p of the lower partition wall 160d is arranged to be separate in the −Y axis direction from the facing work W (lower masking member 22), similarly to the lower facing plane portion 121d. The gap between the plane surface 121p of the lower partition wall 160d and the work W is smaller than the gap between the bottom surface 126d of the lower second recessed portion 127d and the lower masking member 22, and forms a communication path between the lower first recessed portion 124 and the lower second recessed portion 127d.

Raw material gas is supplied to the second recessed portions 117d, 127d from the first recessed portions 114, 124 through the communication path between the first recessed portions 114, 124 and the second recessed portions 117d, 127d. Thus, also in the second recessed portions 117d, 127d, it is possible to generate sufficient plasma enabling increase of a temperature of the masking member 20 of the facing work W and the part not to be processed 10B covered by the masking member 20, similarly to the second recessed portion 117, 127 (see FIG. 3).

Similarly to the above-described first embodiment, also in the fifth embodiment, the distance from a contact point P1d between the work W and the insulation member 30 to the upper facing plane portion 111d is smaller than the distance between the work W and the bottom surface 116d of the upper second recessed portion 117d. Moreover, the distance from a contact point P2d between the work W and the insulation member 30 to a lower facing plane portion 121d is smaller than the distance between the work W and the bottom surface 126d of the lower second recessed portion 127d. In addition, the distance along the X axis from a connecting portion Q1d between the upper second recessed portion 117d and the upper facing plane portion 111d to the contact point P1d, and the distance along the X axis from a connecting portion Q2d between the lower second recessed portion 127d and the lower facing plane portion 121d to the contact point P2d are set to a value larger than 0 (zero). As a result, the contact points P1d, P2d, and the contact portion between the power introducing unit 71 and the masking member 20 are arranged at positions between the upper facing plane portion 111d and the lower facing plane portion 121d. Note that other configurations of the plasma device 200d of the fifth embodiment are same as those of the plasma device 200 of the first embodiment. Thus, the illustration and description thereof is omitted.

The plasma device 200d is also able to suppress occurrence of plastic deformation of the object to be processed 10, similarly to the first embodiment. Moreover, it is possible to suppress occurrence of abnormal discharge in the plasma device 200d.

In the plasma device 200d of the embodiment, the first recessed portion 114 and the second recessed portion 117d are divided by the partition wall 160u. Moreover, the first recessed portion 124 and the second recessed portion 127d are divided by the partition wall 160d. Therefore, as compared with the form in which the first recessed portion and the second recessed portion are not divided by a partition wall, it is possible, in the processing of forming a thin film on the part to be processed 10A of the work W, to reduce a pressure in the first recessed portions 114, 124 for shorter time and fulfill the inside of the first recessed portions 114, 124 with processing gas with necessary density for shorter time.

F. Sixth Embodiment

Figure 9:
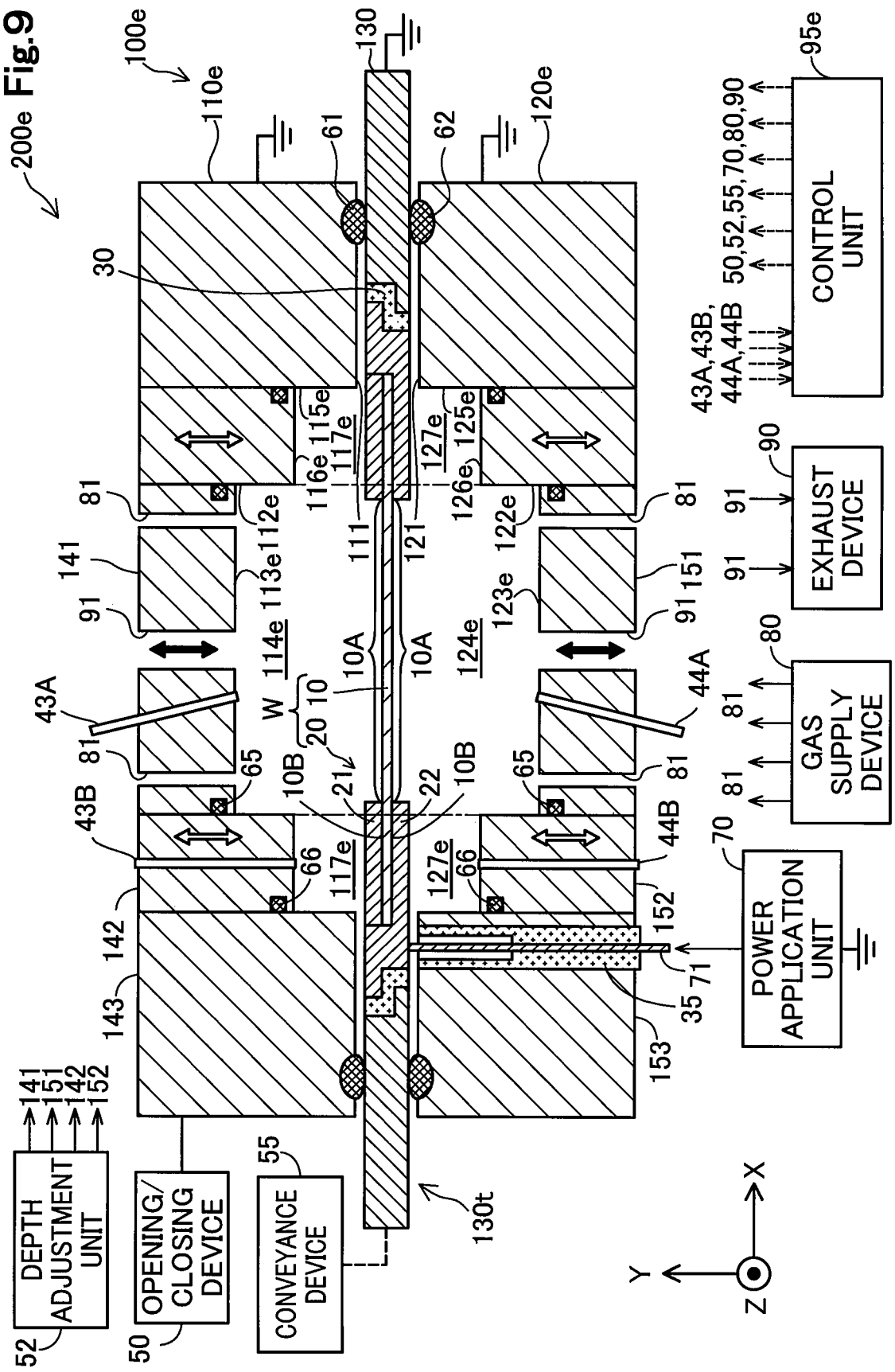
FIG. 9 is a diagram illustrating a plasma device according to a sixth embodiment.

FIG. 9 is a diagram illustrating a plasma device 200e in the sixth embodiment. A main difference between the plasma device 200e and the plasma device 200 of the above-described first embodiment (see FIG. 1) lies in that the plasma device 200e includes a bottom surface allowing a change of a depth of the first recessed portion and a bottom surface allowing a change of a depth of the second recessed portion.

In the plasma device 200e, a first mold 110e of a vacuum vessel 100e is divided to a first mold part 141 having a bottom surface 113e of a first recessed portion 114e, a second mold part 142 having a bottom surface 116e of a second recessed portion 117e, and a third mold part 143 having the facing plane portion 111. A second mold 120e of the vacuum vessel 100e is also divided to a first mold part 151 having a bottom surface 123e of a first recessed portion 124e, a second mold part 152 having a bottom surface 126e of a second recessed portion 127e, and a third mold part 153 having the facing plane portion 121, similarly to the first mold 110e.

In the first mold parts 141, 151, a sealing member 65 for keeping airtightness in the vacuum vessel 100e is fitted in a groove on the outer surface on the side of the second mold parts 142, 152. Also in the second mold parts 142, 152, a sealing member 66 for keeping airtightness in the vacuum vessel 100e is fitted in a groove on the outer surface on the side of the third mold parts 143, 153. As the sealing members 65, 66, O-rings are used. Note that the first mold parts 141, 151 correspond to the "movable bottom surface member that forms a bottom surface of the first recessed portion", and the second mold parts 142, 152 correspond to the "movable bottom surface member that forms the bottom surface of the second recessed portion".

Moreover, the plasma device 200e includes the opening/closing device 50, the conveyance device 55, the power application unit 70, the gas supply device 80, and the exhaust device 90, similarly to the plasma device 200 of the first embodiment (see FIG. 1), and a control unit 95e instead of the control unit 95. Furthermore, the plasma device 200e includes a depth adjustment unit 52, first radiation thermometers 43A, 44A that measure a temperature of the part to be processed 10A of the work W, and second radiation thermometers 43B, 44B that measure a temperature of the masking member 20 (upper masking member 21, lower masking member 22) covering the part not to be processed 10B.

The bottom surface 113e of the upper first mold part 141, the bottom surface 123e of the lower first mold part 151, the bottom surface 116e of the upper second mold part 142, and the bottom surface 126e of the lower second mold part 152 have a structure independently movable in the Y direction by the depth adjustment unit 52. In this manner, the depth adjustment unit 52 is able to independently adjust a depth of the upper first recessed portion 114e, a depth of the lower first recessed portion 124e, a depth of the upper second recessed portion 117e, and a depth of the lower second recessed portion 127e.

The control unit 95e is able to find a temperature difference between the upper surface side of the part to be processed 10A and the upper surface side of the part not to be processed 10B based on the temperatures of the upper first radiation thermometer 43A and the upper second radiation thermometer 43B. The control unit 95e is able to find a temperature difference between the lower surface side of the part to be processed 10A and the lower surface side of the part not to be processed 10B based on the temperatures of the lower first radiation thermometer 44A and the lower second radiation thermometer 44B. Then, the control unit 95e controls the depth adjustment unit 52 to change the depths of the first recessed portions 114e, 124e and the second recessed portions 117e, 127e to adjust the depths of the first recessed portions 114e, 124e and the second recessed portions 117e, 127e so that a temperature difference between the part to be processed 10A and the part not to be processed 10B is within a predetermined allowable temperature difference.

For example, in the phase of adjusting the device before the start of actual plasma processing, the depths of the first recessed portions 114e, 124e and the second recessed portions 117e, 127e are changed preliminarily, and plasma processing for adjustment is performed repeatedly, which enables the following adjustment. That is, it is possible to preliminarily adjust the depths of the first recessed portions 114e, 124e and the second recessed portions 117e, 127e so that a temperature difference between the part to be processed 10A and the part not to be processed 10B is within an allowable temperature difference. Thus, it is possible to reduce a temperature difference between the part to be processed 10A and the part not to be processed 10B. Note that other configurations of the sixth embodiment are same as those of the above-described first embodiment. Thus, the description thereof is omitted.

This plasma device 200e is also able to suppress occurrence of plastic deformation of the object to be processed 10, similarly to the first embodiment. Moreover, it is possible to suppress occurrence of abnormal discharge in the plasma device 200e.

Note that the above description supposes that the depths of the first recessed portions 114e, 124e and the depths of the second recessed portions 117e, 127e are adjusted. However, it is also possible that only the depths of the second recessed portions 117e, 127e are adjusted, and the depths of the first recessed portions 114e, 124e are fixed. However, with adjustment of both the first and second recessed portions, the temperature difference is adjusted more effectively with a preferable balance. Moreover, it is possible to adjust a size of space in accordance with an amount of plasma necessary for plasma processing.

Moreover, it is also possible to omit the first radiation thermometers 43A, 44A and the second radiation thermometers 43B, 44B. In such a case, when the device is adjusted as described above, a thermometer may be provided inside for adjustment. Moreover, it is also possible, even without a thermometer, to find a depth with which a deformation amount is within an allowable amount by performing plasma processing for adjustment a plurality of times.

Moreover, the above description supposes that it is possible to independently adjust a depth of the upper first recessed portion 114e, a depth of the lower first recessed portion 124e, a depth of the upper second recessed portion 117e, and a depth of the lower second recessed portion 127e.

However, it is also possible that a depth of the upper first recessed portion 114e and a depth of the lower first recessed portion 124e are adjusted to be same and a depth of the upper second recessed portion 117e and a depth of the lower second recessed portion 127e are adjusted to be same.

G. Seventh Embodiment

Figure 10:
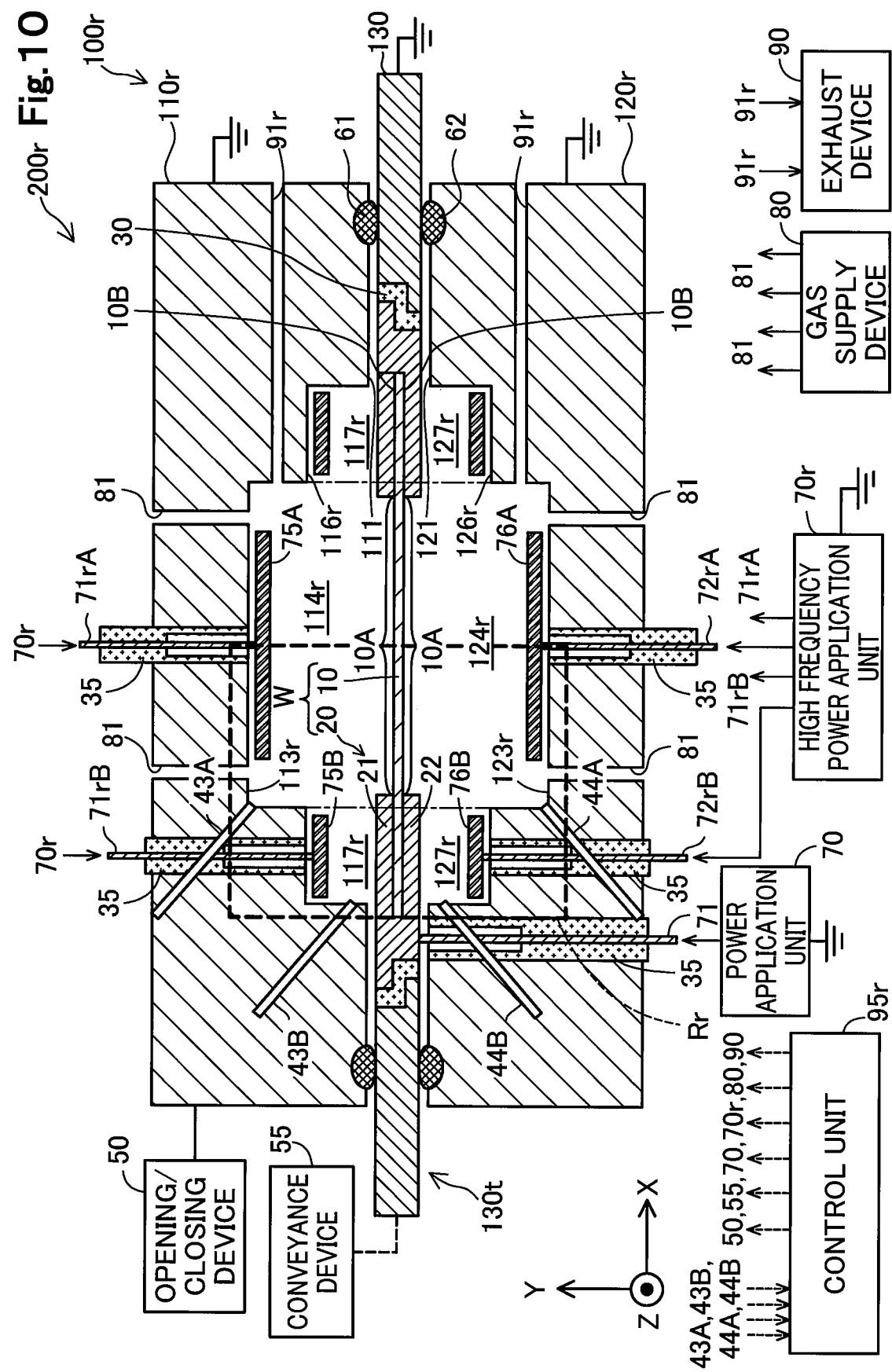
FIG. 10 is a diagram illustrating a plasma device according to a seventh embodiment.

FIG. 10 is a diagram illustrating a plasma device 200r in the seventh embodiment. The plasma device 200r is a device capable of performing plasma processing on the part to be processed 10A of the work W using direct current (DC) power applied by the power application unit 70 and radio frequency (RF) power applied by a high frequency power application unit 70r. Thus, the plasma device 200r includes an upper first application electrode 75A arranged on a bottom surface 113r side in an upper first recessed portion 114r, a lower first application electrode 76A arranged on a bottom surface 123r side in a lower first recessed portion 124r, and the high frequency power application unit 70r. Moreover, the plasma device 200r includes the opening/closing device 50, the conveyance device 55, the power application unit 70, the gas supply device 80, and the exhaust device 90, similarly to, the plasma device 200 of the first embodiment (see FIG. 1), and a control unit 95r instead of the control unit 95.

The control of the control unit 95r controls the high frequency power application unit 70r to apply high frequency power on the first application electrodes 75A, 76A. Note that the high frequency power application unit 70r applies high frequency power independently different in magnitude on each of the first application electrodes 75A, 76A. However, the high frequency power application unit 70r is also able to apply high frequency power same in magnitude on the first application electrodes 75A, 76A.

Moreover, the plasma device 200r includes an upper second application electrode 75B arranged on a bottom surface 116r side in an upper second recessed portion 117r, and a lower second application electrode 76B arranged on a bottom surface 126r side in a lower second recessed portion 127r. The control of the control unit 2 controls the high frequency power application unit 70r to apply high frequency power on the second application electrodes 75B, 76B. Note that the high frequency power application unit 70r applies high frequency power independently different in magnitude on each of the second application electrodes 75B, 76B. However, the high frequency power application unit 70r is also able to apply high frequency power same in magnitude on the second application electrodes 75B, 76B.

A first mold 110r includes a power introducing unit 71rA for applying high frequency power on the upper first application electrode 75A, a power introducing unit 71rB for applying high frequency power on the upper second application electrode 75B, and an exhaust port 91r for evacuating the vacuum vessel 100r. A second mold 120r includes a power introducing unit 72rA for applying high frequency power on the lower first application electrode 76A, a power introducing unit 72rB for applying high frequency power on the lower second application electrode 76B, and an exhaust port 91r for evacuating the vacuum vessel 100r. The insulation member 35 electrically insulates the power introducing unit 71rA from the first mold 110r, between the power introducing unit 71rB from the first mold 110r, the power introducing unit 72rA from the second mold 120r, and the power introducing unit 72rB from the second mold 120r.

In the seventh embodiment, the distance between the upper first application electrode 75A and the first mold 110r and the distance between the upper second application electrode 75B and the first mold 110r are smaller than a distance (thickness) of a sheath formed between the upper first mold 110r and the work W. Thus, plasma is not generated between the upper first application electrode 75A and the first mold 110r and between the upper second application electrode 75B and the first mold 110r. The same applies to the distance between the lower first application electrode 76A and the second mold 120r and the distance between the lower second application electrode 76B and the second mold 120r, and no plasma is generated between these.

In the seventh embodiment, parts of the work W positioned in the first recessed portions 114r, 124r and the second recessed portions 117r, 127r do not have a hole penetrating the upper surface side and the lower surface side of the work W. In the state where the vacuum vessel 100r is closed, the work W divides (defines) space in the upper first recessed portion 114r and the upper second recessed portion 117r from space in the lower first recessed portion 124r and the lower second recessed portion 127r. Therefore, such space is insulated electrically. That is, the work W divides plasma generated in the upper first recessed portion 114r and the upper second recessed portion 117r from plasma generated in the lower first recessed portion 124r and the lower second recessed portion 127r.

Moreover, similarly to the plasma device 200e of the above-described fifth embodiment (see FIG. 9), the plasma device 200r includes the first radiation thermometers 43A, 44A that measure a temperature of the part to be processed 10A of the work W, and the second radiation thermometers 43B, 44B that measure a temperature of the masking member 20 (upper masking member 21, lower masking member 22) covering the part not to be processed 10B. The control unit 95r is able to find a temperature difference between the upper surface side of the part to be processed 10A and the upper surface side of the part not to be processed 10B based on the temperatures of the upper first radiation thermometer 43A and the upper second radiation thermometer 43B. The control unit 95r is able to find a temperature difference between the lower surface side of the part to be processed 10A and the lower surface side of the part not to be processed 10B based on the temperatures of the lower first radiation thermometer 44A and the lower second radiation thermometer 44B. Note that there will be described later the temperatures of the first radiation thermometers 43A, 44A and the second radiation thermometers 43B, 44B, and the temperature difference between the part to be processed 10A and the part not to be processed 10B that is found based on such temperatures. Other configurations of the plasma device 200r of the seventh embodiment are same as those of the plasma device 200 of the first embodiment. Thus, the description thereof is omitted.

In the plasma processing by the plasma device 200r, in the step where power is applied in the plasma processing method of the above-described first embodiment (Step S50 of FIG. 4), DC power is applied on the work W and, further, the high frequency power application unit 70r applies high frequency power on the first application electrodes 75A, 76A and the second application electrodes 75B, 76B. Other plasma processing methods of the seventh embodiment are same as those of the above-described first embodiment. Thus, the description thereof is omitted.

In the plasma device 200r of the seventh embodiment, the work W divides space in the upper first recessed portion 114r and the upper second recessed portion 117r from space in the lower first recessed portion 124r and the lower second recessed portion 127r, and such space is insulated electrically. Therefore, it is possible to suppress interference between phases of a high frequency applied on the upper first application electrode 75A and a high frequency applied on the lower first application electrode 76A. As a result, film disposition or etching on the part to be processed 10A of the work W is possible while using applied power efficiently. Therefore, it is possible to increase film deposition density and etching density of the part to be processed 10A by increasing plasma density in the first recessed portions 114r, 124r. Moreover, when the plasma device 200r deposits a film on the part to be processed 10A, the film thickness may be larger. Meanwhile, when the plasma device 200r performs etching on the part to be processed 10A, the etching amount on the part to be processed 10A may be increased.

Moreover, in the plasma device 200r of the seventh embodiment, the work W divides space in the upper first recessed portion 114r and the upper second recessed portion 117r from space in the lower first recessed portion 124r and the lower second recessed portion 127r. Then, the high frequency power application unit 70r is able to make the magnitude of high frequency power applied on the upper first application electrode 75A different from the magnitude of high frequency power applied on the lower first application electrode 76A. Therefore, the plasma device 200r of the seventh embodiment is able to make film deposition density, etching density, a film thickness, and an etching amount different between the upper surface side and the lower surface side of the part to be processed 10A.

For example, when the object to be processed 10 is a separator used for a fuel cell with a cooling water path formed on the upper surface side of the part to be processed 10A and a fuel gas path formed on the lower surface side thereof, it is preferable to increase film deposition density of at least the lower surface side so as to improve the capacity of the fuel cell. In the plasma device 200r of the seventh embodiment, the power applied on the lower first application electrode 76A is increased while maintaining power applied on the upper first application electrode 75A, which increases film deposition density and etching density only on the lower surface side. Therefore, it is possible to suppress power consumption when the film deposition density and etching density are increased on one surface of the object to be processed 10.

Note that the inventors performed film deposition on the object to be processed 10 while changing power applied on the first application electrodes 75A, 76A in the case where the voltage in the vacuum vessel 100r was 30 Pa, the gas supplied into the vacuum vessel 100r was pyridine gas, and the power applied on the work W by the power application unit 70 was −2500V. As a result, they confirmed that with application of power of −100 W with 13.56 MHz on the upper first application electrode 75A and application of power of −1000 W with 13.56 MHz on the lower first application electrode 76A by the high frequency power application unit 70r, a film with a thickness of 50 nm was formed on the upper surface side of the part to be processed 10A, and a film with a thickness of 80 nm was formed on the lower surface side of the part to be processed 10A. Moreover, the inventors observed the upper surfaces side and the lower surface side of the part to be processed 10A by a field emission-scanning electron microscope (FE-SEM) after film deposition, and confirmed that a minuter film was formed on the lower surface side than the upper surface side.

In the plasma device 200r, as described above, the control unit 95r is able to find a temperature difference between the upper surface side of the part to be processed 10A and the upper surface side of the part not to be processed 10B based on the temperatures of the upper first radiation thermometer 43A and the upper second radiation thermometer 43B. Moreover, the control unit 95r is able to find a temperature difference between the lower surface side of the part to be processed 10A and the lower surface side of the part not to be processed 10B based on the temperatures of the lower first radiation thermometer 44A and the lower second radiation thermometer 44B. Apart from high frequency power applied on the first application electrodes 75A, 76A, the high frequency power application unit 70r is able to independently set the magnitude of high frequency power applied on the upper second application electrode 75B and the magnitude of high frequency power applied on the lower second application electrode 76B. Therefore, it is possible to change density of plasma generated in the second recessed portions 117r, 127r in accordance with the magnitude of high frequency power applied, and independently change the temperatures of the upper surface side and the lower surface side of the part not to be processed 10B. Therefore, the high frequency power application unit 70r is able to control, by the control of the control unit 95r, the magnitude of high frequency power applied on the second application electrodes 75B, 76B so that the temperature difference between the part to be processed 10A and the part not to be processed 10B is within a predetermined allowable temperature difference. This enables adjustment for reducing a temperature difference between the part to be processed 10A and the part not to be processed 10B.

This plasma device 200r is also able to suppress occurrence of plastic deformation of the object to be processed 10, similarly to the first embodiment. Moreover, it is possible to suppress occurrence of abnormal discharge in the plasma device 200r.

Note that it is not necessary that the high frequency power application unit 70r controls the magnitude of high frequency power applied on the second application electrodes 75B, 76B every time the plasma processing is performed. Moreover, it is neither necessary that the high frequency power application unit 70r controls the magnitude of high frequency power applied on the first application electrodes 75A, 76A every time the plasma processing is performed. For example, it is also possible, in the phase of adjusting the device before the start of actual plasma processing, to preliminarily find and set the magnitude of high frequency power with which a temperature difference between the part to be processed 10A and the part not to be processed 10B is within an allowable temperature difference Moreover, it is also possible to omit the first radiation thermometers 43A, 44A and the second radiation thermometers 43B, 44B. In such a case, when the device is adjusted as described above, a thermometer may be provided inside for adjustment. Moreover, it is also possible, even without a thermometer, to find the magnitude of high frequency power with which deformation amount is within an allowable amount by performing plasma processing for adjustment a plurality of times.

In the above description, there is independently set the magnitude of high frequency power applied on the upper first application electrode 75A, the upper second application electrode 75B, the lower first application electrode 76A, and the lower second application electrode 76B. However, the same magnitude of high frequency power may be applied on the upper first application electrode 75A and the lower first application electrode 76A, and the same magnitude of high frequency power may be applied on the upper second application electrode 75B and the lower second application electrode 76B.

Moreover, the above description has exemplified the configuration in which the power application unit 70 applies DC power on the work W and, further, the high frequency power application unit 70*r* applies high frequency power on the first application electrodes 75A, 76A and the second application electrodes 75B, 76B. However, in the configuration where high frequency power is applied on the first application electrodes 75A, 76A and the second application electrodes 75B, 76B, it is possible to omit application of DC power on the work W by the power application unit 70.

H. Eighth Embodiment

Figure 11:
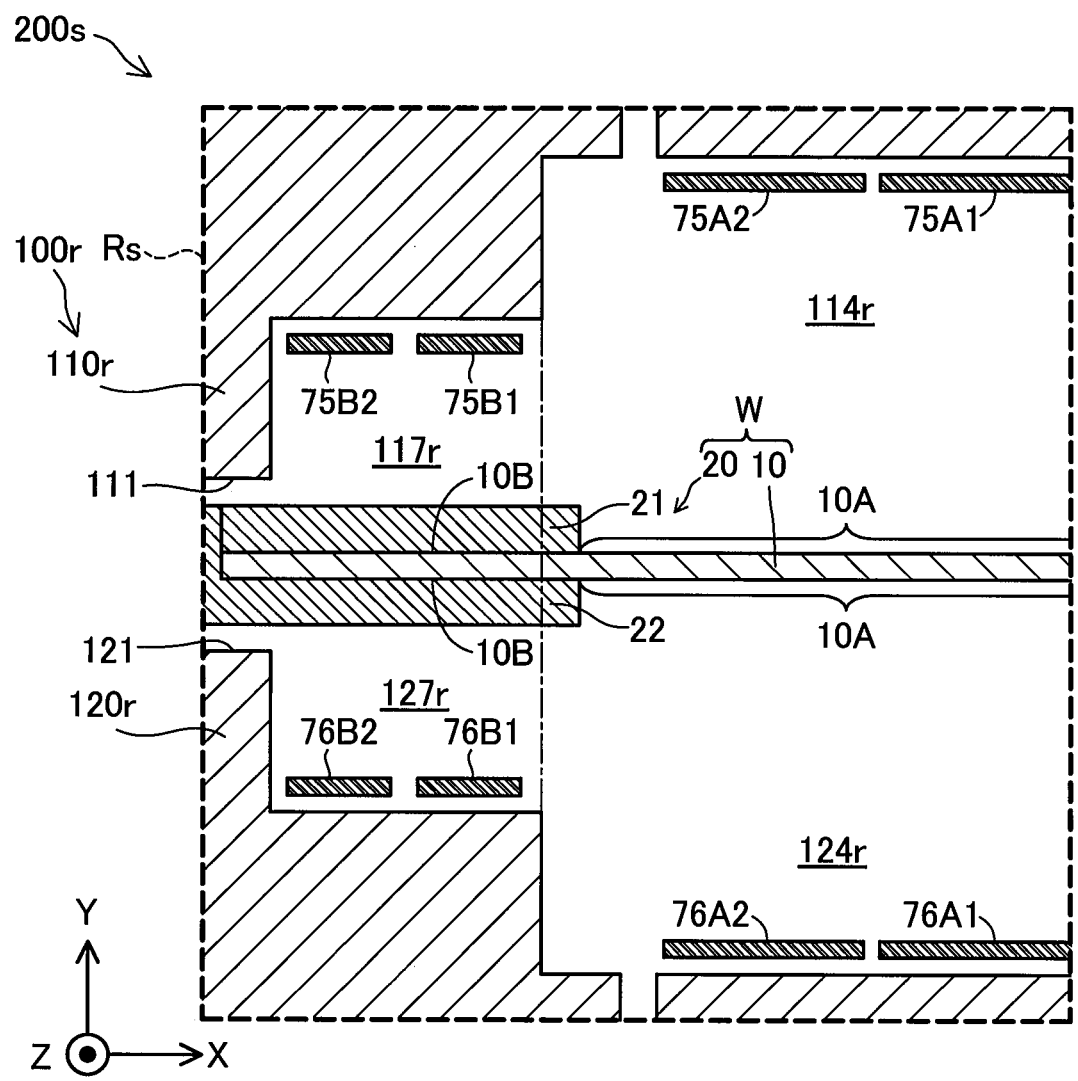
FIG. 11 is a partial schematic section view partially illustrating a configuration of a plasma device according to an eighth embodiment.

FIG. 11 is a partial schematic section view partially illustrating a configuration of a plasma device 200*s* in the eighth embodiment. FIG. 11 illustrates a part Rs corresponding to the Rr part of FIG. 10. A difference between the plasma device 200*s* of the eighth embodiment and the plasma device 200*r* of the seventh embodiment lies in that each of the first application electrodes 75A, 76A and the second application electrodes 75B, 76B is divided to a plurality of electrodes.

In the example of the eighth embodiment, the upper first application electrode 75A is divided to a divided electrode 75A1 on the inner periphery side and a divided electrode 75A2 on the outer periphery side, and the lower first application electrode 76A is divided to a divided electrode 76A1 on the inner periphery side and a divided electrode 76A2 on the outer periphery side. Moreover, the upper second application electrode 75B is divided to a divided electrode 75B1 on the inner periphery side and a divided electrode 75B2 on the outer periphery side, and the lower second application electrode 76B is divided to a divided electrode 76B1 on the inner periphery side and a divided electrode 76B2 on the outer periphery side. The divided electrodes 75A1, 75A2 of the first application electrodes and the divided electrodes 75B1, 75B2 of the second application electrodes on the upper side are disposed in positions symmetrical in the vertical direction (Y direction) to the divided electrodes 76A1, 76A2 of the first application electrode and the divided electrodes 76B1, 76B2 of the second application electrode, respectively, on the lower side.

Moreover, although the illustration is omitted, a power introducing unit is connected to each of the divided electrodes 75A1, 75A2, 75B1, 75B2, 76A1, 76A2, 76B1, 76B2, and the high frequency power application unit applies high frequency power with magnitude set independently. Moreover, although the illustration is omitted, the plasma device 200*s* includes a plurality of (four) first radiation thermometers measuring a temperature of each position of the work W facing a plurality of divided electrodes 75A1, 75A2, 76A1, 76A2 of the upper and lower first application electrodes, and a plurality of (four) second radiation thermometers measuring a temperature of each position of the work W facing a plurality of divided electrodes 75B1, 75B2, 76B1, 76B2 of the upper and lower second application electrodes. Note that other configurations of the plasma device 200*s* of the eighth embodiment are same as those of the plasma device 200*r* of the seventh embodiment. Thus, the description thereof is omitted.

In the plasma device 200*s*, the second application electrodes 75B, 76B arranged in the second recessed portions 117*r*, 127*r* of the plasma device 200*r* of the seventh embodiment (see FIG. 10) are divided to a plurality of divided electrodes 75B1, 75B2, 76B1, 76B2. Thus, when temperature distribution has occurred on the part not to be processed 10B of the work W, the magnitude of high frequency power applied on each of the divided electrodes 75B1, 75B2, 76B1, 76B2 may be controlled so as to suppress such temperature distribution. In this manner, it is possible to more effectively reduce a temperature difference between the part not to be processed 10B and the part to be processed 10A, which enables suppression of occurrence of plastic deformation of the object to be processed 10.

Moreover, in the plasma device 200*s*, the first application electrodes 75A, 76A disposed in the first recessed portions 114*r*, 124*r* of the plasma device 200*r* of the seventh embodiment are divided to a plurality of divided electrodes 75A1, 75A2, 76A1, 76A2. Thus, when the temperature distribution has occurred on the part to be processed 10A of the work W, the magnitude of high frequency power applied on each of the divided electrodes 75A1, 75A2, 76A1, 76A2 may be controlled to suppress the temperature distribution. In this manner, it is possible to effectively suppress variation of film deposition and etching by plasma processing on the part to be processed 10A.

This plasma device 200*s* is also able to suppress occurrence of plastic deformation of the object to be processed 10, similarly to the first embodiment. Moreover, it is possible to suppress occurrence of abnormal discharge in the plasma device 200*s*.

Note that in the plasma device 200*s* of the eighth embodiment, it is not necessary to control the magnitude of high frequency power applied on a plurality of divided electrodes 75B1, 75B2, 76B1, 76B2 of the second application electrodes every time plasma processing is performed. For example, it is also possible, in the phase of adjusting the device before the start of actual plasma processing, to preliminarily suppress temperature distribution of the part not to be processed 10B and temperature distribution of the part to be processed 10A, and find and set the magnitude of high frequency power with which a temperature difference between the part to be processed 10A and the part not to be processed 10B is within an allowable temperature difference.

Moreover, it is also possible to omit the first radiation thermometers and the second radiation thermometers. In such a case, in the above-described adjustment, a thermometer may be provided inside for adjustment, for example. Moreover, it is also possible, even without a thermometer, to find the magnitude of high frequency power with which a deformation amount is within an allowable amount by performing film deposition processing for adjustment a plurality of times.

The above has exemplified the case in which the magnitude of high frequency power applied on each of the divided electrodes 75A1, 75A2, 75B1, 75B2, 76A1, 76A2, 76B1, 76B2 is set independently. However, it is also possible to apply high frequency power with the same magnitude on the divided electrodes disposed in symmetrical positions in the vertical direction (Y direction).

Moreover, the above has exemplified the case in which the divided electrodes 75A1, 75A2, 76A1, 76A2 corresponding to a plurality of first application electrodes are disposed on the inner periphery side and the outer periphery side of the first recessed portions 114*r*, 124*r*, and the divided electrodes 75B1, 75B2, 76B1, 76B2 corresponding to a plurality of second application electrodes are disposed on the inner periphery side and the outer periphery side of the second recessed portions 117*r*, 127*r*. However, the number of electrodes and the arrangement positions thereof are not limited thereto. That is, as long as it is possible to suppress temperature distribution of the part to be processed 10A arranged facing the first recessed portions 114r, 124r and the temperature of the part not to be processed 10B facing the second recessed portions 117r, 127r, the number of electrodes and the arrangement positions thereof are not particularly limited.

I. Modifications

Note that the disclosure is not limited to the above-described examples and embodiments, and may be implemented in various forms without departing from the scope of the disclosure. For example, the following modifications are also possible.

(1) Modification 1

In the plasma processing method of the plasma device 200 of the above-described first embodiment (see FIG. 4), to increase a film deposition speed, for example, the power application unit 70 may apply power between the work W (object to be processed 10, masking member 20) and the vacuum vessel 100 before supply of raw material gas so as to increase a temperature of the work W.

(2) Modification 2

In the above-described first embodiment, as illustrated in FIG. 3, the distance A1 between the contact point P1 and the facing plane portion 111 is smaller than a distance of a sheath formed between the work W and the facing plane portion 111. The distance A2 between the contact point P2 and the facing plane portion 121 is smaller than a distance of a sheath formed between the work W and the facing plane portion 121. Meanwhile, one of the distance A1 and the distance A2 may be larger than the distance of the sheath, or both may be larger than the distance of the sheath. In the above-described first embodiment, the distance A1 and the distance A2 are equal to or smaller than 2.0 mm. Meanwhile, one of the distance A1 and the distance A2 may be larger than 2.0 mm, or both may be larger than 2.0 mm.

In the above-described embodiment, the facing plane portion 111 is arranged to surround and be connected to the second recessed portion 117. However, the facing plane portion may be arranged to be connected to the second recessed portion without surrounding the first and second recessed portions. The facing plane portion may be arranged to be connected to the first recessed portion without the second recessed portions. The facing plane portion may be arranged to be connected to the second recessed portion by one portion, and be connected to the first recessed portion without the second recessed portions by another portion.

(3) Modification 3

In the above-described first embodiment, the upper first recessed portion 114 includes the side surface 112 and the bottom surface 113, as illustrated in FIG. 3. However, the upper first recessed portion 114 may be hemisphere, for example, as long as it is recessed in a direction apart from the object to be processed 10 from the facing plane portion 111. In this case, the bottom surface 113 of the upper first recessed portion 114 may be at a position farthest from the work W facing the upper first recessed portion 114, and the distance B1 between the work W and the bottom surface 113 of the upper first recessed portion 114 may be a distance between the work W facing the first recessed portion 114 and a position farthest from the work W of the first recessed portion 114. Moreover, the upper second recessed portion 117 includes the side surface 115 and the bottom surface 116. However, it is only necessary that the upper second recessed portion 117 is also recessed in a direction apart from the object to be processed 10 from the facing plane portion 111, similarly to the upper first recessed portion 114. The lower first recessed portion 124 and the lower second recessed portion 127 are also same as the upper first recessed portion 114 and the upper second recessed portion 117.

In the above-described embodiment, the depth of the second recessed portion 117 is set to be smaller than the depth of the first recessed portion 114 (see FIG. 1, FIG. 3, and FIG. 5 to FIG. 8). However, the depth of the second recessed portion may be set to be larger than the depth of the first recessed portion.

In the above-described sixth embodiment, the bottom surface 113e of the upper first mold part 141, the bottom surface 123e of the lower first mold par 151, the bottom surface 116e of the upper second mold part 142, and the bottom surface 126e of the lower second mold part 152 have a structure independently movable in the Y direction by the depth adjustment unit 52 (see FIG. 9).

However, it is also possible to configure such that the bottom surface 113e of the upper first mold part 141 and the bottom surface 116e of the upper second mold part 142 are movable in the Y direction, while the bottom surface 123e of the lower first mold part 151 and the bottom surface 126e of the lower second mold part 152 are unmovable. Alternatively, it is also possible to configure such that the bottom surface 116e of the upper second mold part 142 and the bottom surface 126e of the lower second mold part 152 are movable in the Y direction, while the bottom surface 113e of the upper first mold par 141 and the bottom surface 123e of the lower first mold part 151 are immovable. That is, it is possible to configure such that at least a part of the bottom surfaces is movable.

(4) Modification 4

In the above-described first embodiment, the vacuum vessel 100 and the pallet 130 have an earth potential, as illustrated in FIG. 1. However, the vacuum vessel 100 and the pallet 130 may not have an earth potential as long as the power application unit 70 is able to apply power between the vacuum vessel 100 and the object to be processed 10 for plasma processing by film deposition or etching on the object to be processed 10.

(5) Modification 5

In the above-described first embodiment, the object to be processed 10 is a separator for fuel cells. However, the object to be processed 10 may be any member having conductivity. Moreover, in the above-described first embodiment, the plasma device 200 deposits a carbon thin film. However, it is also possible to form, in film deposition, a thin film of other conductive elements such as gold (Au), platinum (Pt), tantalum (Ta), and silicone (Si).

(6) Modification 6

The plasma device 200 of the above-described first embodiment (see FIG. 1) may be rotated by 90° in a clockwise direction or a counterclockwise direction with the Z axis direction as a center. In this modification, the vacuum vessel 100 is opened and closed in the X axis direction. Note that it is preferable in this modification that the insulation member 30, the masking member 20, and the pallet 130 are fit in one another with bonding power preventing falling. Alternatively, it is preferable that each of the insulation member 30, the masking member 20, and the pallet 130 is fastened by a bolt and the like, for example.

(7) Modification 7

It is possible to arbitrarily combine the above-described embodiments and modifications for application. For example, the plasma device with inclined surfaces (see FIG. 5) or the plasma device with partition walls (see FIG. 8) may have the form in which the bottom surface of the recessed portion is movable (see FIG. 9).

Moreover, in each of the above-described embodiments, the structure provided in both the first mold and the second mold (e.g., inclined surfaces 23a, 24a of the masking member 20a in FIG. 5, partition walls 160u, 160d in FIG. 8, mold parts 141, 142, 151, 152 in FIG. 9) may be provided only in the first mold or only in the second mold. Furthermore, the first mold and the second mold of each embodiment may be switched and arranged. That is, the first mold may be a lower die, and the second mold may be an upper die.

The disclosure is not limited to any of the embodiment and its modifications described above but may be implemented by a diversity of configurations without departing from the scope of the disclosure. For example, the technical features of any of the above embodiments and their modifications may be replaced or combined appropriately, in order to solve part or all of the problems described above or in order to achieve part or all of the advantageous effects described above. Any of the technical features may be omitted appropriately unless the technical feature is described as essential in the description hereof. The present disclosure may be implemented by aspects described below.

(1) One aspect of the disclosure provides a plasma device that performs plasma processing on a work The plasma device comprises: a vessel including a first mold and a second mold that are disposed facing to each other and form sealed space in which the work is disposed. The work includes: an object to be processed with a part to be processed and a part not to be processed disposed to surround the part to be processed; and a masking member covering the part not to be processed. The first mold includes: a first recessed portion that is disposed facing the part to be processed and generates plasma; a second recessed portion that is disposed facing at least a part of the masking member covering the part not to be processed and generates plasma; and a facing plane portion that is disposed to surround the first recessed portion and the second recessed portion, and is disposed at a position closer to the second mold than the first recessed portion and the second recessed portion. A depth of the second recessed portion is set to be a different value from a depth of the first recessed portion.

The plasma device in such an aspect is able to increase a temperature of the part not to be processed by plasma generated in the second recessed portion and suppress a temperature difference between a temperature of the part to be processed and the part not to be processed. This enables suppression of deformation of the object to be processed.

(2) In the plasma device according to the above-described aspect, the depth of the second recessed portion is set to be smaller than the depth of the first recessed portion.

The plasma device in such an aspect is able to increase a temperature of the part not to be processed by plasma generated in the second recessed portion while suppressing the increase of a size of space in which the work is sealed.

(3) In the plasma device according to the above-described aspect, the first mold further includes a partition wall that divides the first recessed portion from the second recessed portion. A gap is formed between the partition wall and the masking member. The gap is smaller than a gap between a bottom surface of the second recessed portion and the masking member.

In the plasma device in such an aspect, substances in the first recessed portion flow in to the second recessed portion through the gap. Thus, plasma is generated also in the second recessed portion. As a result, it is possible to increase a temperature of the part not to be processed in the second recessed portion and suppress a temperature difference between a temperature of the part to be processed and a temperature of the part not to be processed. This enables suppression of deformation of the object to be processed.

(4) In the plasma device according to the above-described aspect, the first mold includes a movable bottom surface member that forms the bottom surface of the second recessed portion. The plasma device includes a depth adjustment unit that changes a position of the bottom surface of the second recessed portion to adjust the depth of the second recessed portion.

The plasma device in such an aspect is able to adjust the depth of the second recessed portion to increase a temperature of the part not to be processed so that a temperature difference between the part to be processed and the part not to be processed is an appropriate value, and appropriately set a size of sealed space formed by the first mold and the second mold.

(5) In the plasma device according to the above-described aspect, the first mold includes a movable bottom surface member that forms a bottom surface of the first recessed portion. The depth adjustment unit changes a position of the bottom surface of the first recessed portion to adjust the depth of the first recessed portion.

The plasma device in such an aspect is able to independently adjust the depths of the first recessed portion and the second recessed portion so that a temperature difference between the part to be processed and the part not to be processed is small. Moreover, it is possible to adjust the depths of the first recessed portion and the second recessed portion in accordance with an amount of plasma necessary for plasma processing on the part to be processed.

(6) The plasma device according to the above-described aspect may further include: a first radiation thermometer that measures a temperature of the part to be processed; and a second radiation thermometer that measures a temperature of a part of the masking member corresponding to the part not to be processed. The depth adjustment unit performs the adjustment so that a temperature difference between a temperature of the part to be processed measured by the first radiation thermometer and a temperature of the part not to be processed measured by the second radiation thermometer is within a predetermined allowable temperature difference.

The plasma device in such an aspect is able to securely adjust a temperature difference between a temperature of the part to be processed and a temperature of the part not to be processed within a predetermined allowable temperature difference.

(7) The plasma device according to the above-described aspect may further include: a first application electrode that is disposed in the first recessed portion; a second application electrode that is disposed in the second recessed portion; and a high frequency power application unit that applies high frequency power independently on the first application electrode and the second application electrode.

The plasma device in such an aspect is able to decrease a temperature difference between the part to be processed and the part not to be processed by applying high frequency power on the second application electrode and increasing a temperature of the part not to be processed.

(8) The plasma device according to the above-described aspect may further include: a first radiation thermometer that measures a temperature of the part to be processed; and a second radiation thermometer that measures a temperature of a part of the masking member corresponding to the part not to be processed. The high frequency power application unit adjusts high frequency power applied at least on the second application electrode so that a temperature difference between a temperature of the part to be processed measured by the first radiation thermometer and a temperature of the part not to be processed measured by the second radiation thermometer is within a predetermined allowable temperature difference.

The plasma device in such an aspect is able to securely adjust a temperature difference between a temperature of the part to be processed and a temperature of the part not to be processed within a predetermined allowable temperature difference.

It is also possible to achieve the disclosure in various aspects other than the above-described plasma device. For example, the disclosure may be achieved by the aspects of a method of plasma processing, a method and a device for controlling a plasma device, a computer program for achieving functions of such a device or method, and a recording medium recording the computer program.

What is claimed is:

1. A plasma device that performs plasma processing on a work, comprising:
   a vessel including a first mold and a second mold facing each other forming a sealed space in which the work is disposed, wherein
   the work includes
      an object to be processed with
         a part to be processed and
         a part not to be processed in a peripheral side of the object relative to a part of the part to be processed as viewed along a direction perpendicular to the object, and
      a masking member covering the part not to be processed,
   the first mold includes
      a first recessed portion that is facing the part to be processed and that generates plasma,
      a second recessed portion that is facing at least a part of the masking member covering the part not to be processed and that generates plasma, and
      a facing plane portion that surrounds the first recessed portion and the second recessed portion, and that is closer to the second mold than the first recessed portion and the second recessed portion,
   a depth of the second recessed portion is different from a depth of the first recessed portion,
   the first mold and the second mold are configured to retain the work so that at least a part of the masking member and the second recessed portion face each other,
   the depth of the first recessed portion is a distance between the facing plane portion and a bottom surface of the first recessed portion, the bottom surface of the first recessed portion being opposite to an opening of the first recessed portion,
   the depth of the second recessed portion is a distance between the facing plane portion and a bottom surface of the second recessed portion, the bottom surface of the second recessed portion being opposite to an opening of the second recessed portion, and
   the bottom surface of the first recessed portion and the bottom surface of the second recessed portions are both surfaces formed by respective inner walls, wherein
   the first mold further includes a partition wall that divides the first recessed portion from the second recessed portion,
   a gap is formed between the partition wall and the masking member, and
   the gap is smaller than a gap between the bottom surface of the second recessed portion and the masking member.

2. The plasma device according to claim 1, wherein the depth of the second recessed portion is set to be smaller than the depth of the first recessed portion.

3. The plasma device according to claim 1, wherein the first mold includes a movable bottom surface member that forms the bottom surface of the second recessed portion, and
   the bottom surface of the second recessed portion is movable to adjust the depth of the second recessed portion.

4. The plasma device according to claim 3, wherein the first mold includes a movable bottom surface member that forms the bottom surface of the first recessed portion, and
   a position of the bottom surface of the first recessed portion is movable to adjust the depth of the first recessed portion.

5. The plasma device according to claim 3, further comprising:
   a first radiation thermometer that measures a temperature of the part to be processed, and
   a second radiation thermometer that measures a temperature of a part of the masking member corresponding to the part not to be processed, wherein
   the bottom surface of the second recessed portion is movable so that a temperature difference between a temperature of the part to be processed measured by the first radiation thermometer and a temperature of the part not to be processed measured by the second radiation thermometer is within a predetermined allowable temperature difference.

6. The plasma device according to claim 1, further comprising:
   a first application electrode that is disposed in the first recessed portion; and
   a second application electrode that is disposed in the second recessed portion;
   wherein the plasma device is configured to apply high frequency power on the first application electrode and to apply high frequency power on the second application electrode.

7. The plasma device according to claim 6, further comprising:
   a first radiation thermometer that measures a temperature of the part to be processed, and
   a second radiation thermometer that measures a temperature of a part of the masking member corresponding to the part not to be processed, wherein
   the plasma device is configured to adjust high frequency power applied at least on the second application electrode so that a temperature difference between a temperature of the part to be processed measured by the first radiation thermometer and a temperature of the part not to be processed measured by the second radiation thermometer is within a predetermined allowable temperature difference.

8. The plasma device according to claim 1, wherein:
   when viewed perpendicular to the facing plane portion, the second recessed portion overlaps the part of the masking member covering the part not to be processed.

* * * * *